United States Patent

Nagano et al.

[11] Patent Number: 6,084,907
[45] Date of Patent: Jul. 4, 2000

[54] ADAPTIVE AUTO EQUALIZER

[75] Inventors: Kouichi Nagano; Kouji Okamoto; Takashi Yamamoto; Masao Hamada, all of Fukuoka, Japan

[73] Assignee: Matsushita Electric Industrial Co., Ltd., Osaka, Japan

[21] Appl. No.: 08/986,324

[22] Filed: Dec. 5, 1997

[30] Foreign Application Priority Data

Dec. 9, 1996 [JP] Japan .................................. 8-328687

[51] Int. Cl.[7] .............................. H03H 7/30; H03H 7/40
[52] U.S. Cl. ..................... 375/230; 375/232; 364/724.2
[58] Field of Search ................................... 375/229, 230, 375/231, 232, 233, 234, 235, 236; 364/724.19, 724.2

[56] References Cited

U.S. PATENT DOCUMENTS

| | | | |
|---|---|---|---|
| 4,322,852 | 3/1982 | Barnes ..................................... | 375/340 |
| 4,468,786 | 8/1984 | Davis ..................................... | 375/229 |
| 4,559,635 | 12/1985 | Sari . | |
| 5,175,746 | 12/1992 | Inoue et al. .............................. | 375/229 |
| 5,267,099 | 11/1993 | Fujiwara et al. . | |
| 5,274,512 | 12/1993 | Tanaka et al. ........................... | 375/229 |
| 5,416,799 | 5/1995 | Currivan et al. ........................ | 375/232 |
| 5,461,640 | 10/1995 | Catherer . | |
| 5,481,565 | 1/1996 | Pal .......................................... | 375/232 |
| 5,526,377 | 6/1996 | Yedid et al. ............................. | 375/229 |
| 5,541,956 | 7/1996 | Ueda . | |
| 5,644,597 | 7/1997 | Ueda . | |
| 5,648,987 | 7/1997 | Yang et al. .............................. | 375/232 |
| 5,768,311 | 6/1998 | Betts et al. .............................. | 375/222 |
| 5,793,806 | 8/1998 | Maeda et al. ........................... | 375/232 |
| 5,805,637 | 9/1998 | Hirosaka et al. ........................ | 375/230 |
| 5,898,731 | 4/1999 | Kwak ...................................... | 375/230 |

*Primary Examiner*—Chi H. Pham
*Assistant Examiner*—Bryan Webster
*Attorney, Agent, or Firm*—McDermott Will & Emery

[57] ABSTRACT

In an adaptive auto equalizer for automatically amending a signal distorted through propagation in a transmission line to the expected value, each multiplication unit includes a plurality of weight coefficient holding units for storing weight coefficients. The number of these weight coefficient holding units is the same as the clock number which is equal to a delay required for updating the weight coefficients. An adder calculates weight coefficients every clock. The storage location of the calculated weight coefficients is switched by a selector, and the weight coefficients calculated every clock are serially held in a corresponding one of the weight coefficient holding units. The other selectors serially select one of the plurality of weight coefficient holding units and the weight coefficients thus held are given to the multiplication units. Consequently, each of the weight coefficients held in the weight coefficient holding units is given to a corresponding one of the multiplication units in a time period corresponding to the clock number equal to the delay time required for updating the weight coefficients. Thus, even if there is a delay before the update of the weight coefficients, an output error does not diverge, which makes it possible to obtain an ideal output signal in a short time and in a stable manner.

20 Claims, 25 Drawing Sheets

ADAPTIVE AUTO EQUALIZER

BACKGROUND OF THE INVENTION

The present invention relates to an improvement of an adaptive auto equalizer which automatically compensates distortion and noise contained in a signal propagated through a transmission line, thereby equalizing the signal to an ideal signal and outputting the ideal signal.

Generally, adaptive equalization refers to a process of shaping the waveform of an input signal into that of an ideal output signal, based on a predetermined adaptive equalization algorithm. According to the process, a signal distorted by the effects of various noises during propagation through a transmission line is restored to an original ideal signal.

The structure of a conventional adaptive auto equalizer is shown in FIG. 25. This drawing shows a transversal filter block 1 and an adaptive control block 2. The transversal filter block 1 includes delay units 11, 12, 13, and 1N, multiplication units 21, 22, 23, and 2N, and addition units 31, 32, and 3M. The adaptive control block 2 includes a determination unit 41, an error detection unit 51, and a coefficient amendment unit 61.

The transversal filter block 1, which is a well-known FIR (Finite Impulse Response) filter, convolutes a plurality of data delayed for a respective predetermined time period to an input signal, and outputs the result. To be more specific, the transversal filter block 1 enters a signal distorted during propagation through a transmission line, and each of the delay units 11, 12, 13, and 1N delays the signal for a predetermined time period. Then, each of the multiplication units 21, 22, 23, and 2N multiplies each delayed data with a corresponding weight coefficient, and the addition units 31, 32, and 3M serially add each multiplication result together and outputs the sum outside.

The adaptive control block 2 serially modifies the weight coefficients used in the multiplication units 21 to 2N, and the weight coefficients change themselves with time. The serial modification of the weight coefficients are necessary for adaptive equalization because in such a system as a hard disk or a compact disk for recording a plurality of signals in high density, an occurrence of inter-code interference from an adjacent bit causes non-liner distortion of the waveform of a signal or a decrease in the amplitude of the signal. In the adaptive control block 2, the determination unit 41 compares a signal outputted from the transversal filter block 1 with a predetermined threshold value, so as to determine and output the expected value of the signal. The error detection unit 51 finds the error between the signal outputted from the transversal filter block 1 and the expected value outputted from the determination unit 41. The coefficient amendment unit 61 calculates the weight coefficients of the multiplication units 21 to 2N of the transversal filter block 1, based on the error value found in the error detection unit 51, and serially modifies the weight coefficients. By repeating this operation, the output signal of the transversal filter block 1 is made closer to the expected value.

However, in the adaptive auto equalizer shown in FIG. 25, the transversal filter block 1 and the adaptive control block 2 are both ideal, so that the update of each weight coefficient is performed without any delay and the output signal of the transversal filter block 1 is converged upon the expected value at an early stage. In actuality, however, the operation of each of the multiplication units 21 to 2N, the addition units 31 to 3M, the determination unit 41, the error detection unit 51, and the coefficient amendment unit 61 includes a delay amount. As a result, it is necessary to update a weight coefficient in a time period corresponding to the sum of these delay amounts. In other words, it is necessary to use the same value of a weight coefficient in the time period corresponding to the total delay amounts. Consequently, there is a problem that it takes long to converge a weight coefficient upon the expected value, which indicates poor convergence.

On the other hand, it is possible to calculate and update a weight coefficient in the coefficient amendment unit 61 for each of the signals entered sequentially. However, appropriate amendment of a weight coefficient relies on obtaining the output signal of the transversal filter block 1 by using the previously updated weight coefficient, so that if the update of a weight coefficient is performed for each of the consecutive signals, the output signal of the transversal filter block 1 is not converged upon the expected value, which results in oscillation.

SUMMARY OF THE INVENTION

The object of the present invention is to solve the aforementioned conventional problems and to provide an adaptive auto equalizer which does not oscillate and has an improved convergence by converging the output signal of the transversal filter block upon an expected value in a short time period even if there is a delay amount in the multiplication units, the addition units, the determination unit, the error detection unit, and the coefficient amendment unit which are included in the transversal filter block or the adaptive control block.

In order to achieve the object, according to the present invention, the adaptive auto equalizer for adaptive-equalizing an input signal by giving a weight coefficient to each of a plurality of multiplication units is so constructed that the coefficient amendment unit is improved, each multiplication unit is provided with a plurality of weight coefficient holding units for storing weight coefficients, and the weight coefficients in the weight coefficient holding units are modified in the time period corresponding to the delay amount by the modification of the weight coefficients, thereby selecting these weight coefficients serially. Consequently, even if there is a delay amount before the modification of a weight coefficient, the weight coefficient can be modified a plurality of number of times within the time period corresponding to the delay amount, so as to improve the convergence.

To be more specific, the adaptive auto equalizer of the present invention comprises: a transversal filter for equalizing an input signal, the transversal filter including a plurality of delay units for delaying the input signal, a plurality of multiplication units for multiplying a weight coefficient with a delay signal of each of the plurality of delay units, and an addition unit for adding multiplication results of the plurality of multiplication units together; a determination unit for receiving an output of the addition unit of the transversal filter and determining an expected value of the output; an error detection unit for detecting an error between an output of the transversal filter and an output of the determination unit; and a selection-type coefficient amendment unit for entering the error outputted from the error detection unit and amending the weight coefficient to be given to each of the plurality of multiplication units, based on the error. The selection-type coefficient amendment unit includes coefficient modification units of the same number as the multiplication units, the coefficient modification units each calculating an amendment value of the weight coefficient and giving an amended weight coefficient to a corresponding one of the plurality of multiplication units. Each of the coefficient modification units includes a plurality of weight coefficient holding units; and a plurality of amended weight coefficients are held in the plurality of weight coefficient holding units by repeatedly selecting one of the plurality of weight coefficient holding units every time the amendment value of the weight coefficient is calculated, so that the weight coefficients thus held are given to a corresponding one of the multiplication units one by one.

According to the above-mentioned structure, as for a weight coefficient to be given to one multiplication unit in the present invention, a coefficient modification unit for amending the weight coefficient is provided with a plurality of weight coefficient holding units for storing the weight coefficients. In the coefficient modification unit, even if a predetermined delay time is required for the modification of the weight coefficient due to the structure of the adaptive auto equalizer, the weight coefficient is modified for a plurality of times within the delay time. It is repeated to select one of the plurality of weight coefficient holding units every time the weight coefficient is modified, and as a result, the weight coefficient to be held in each weight coefficient holding unit is updated in the time period corresponding to the predetermined delay time required for the modification of the weight coefficient. Therefore, when multiplication is performed in a multiplication unit by using the weight coefficient held in each coefficient modification unit, the weight coefficient involved in the multiplication can be amended by using the error obtained in the error detection unit, based on the multiplication, so that the weight coefficient can be properly amended and updated. Thus, the output signal of the transversal filter block can be converged upon the expected value in a short time without oscillating, which results in an improvement of the convergence.

DETAILED DESCRIPTION OF THE INVENTION

The preferred embodiments of the present invention will be described as follows with reference to the drawings.

EMBODIMENT 1

Figure 1:
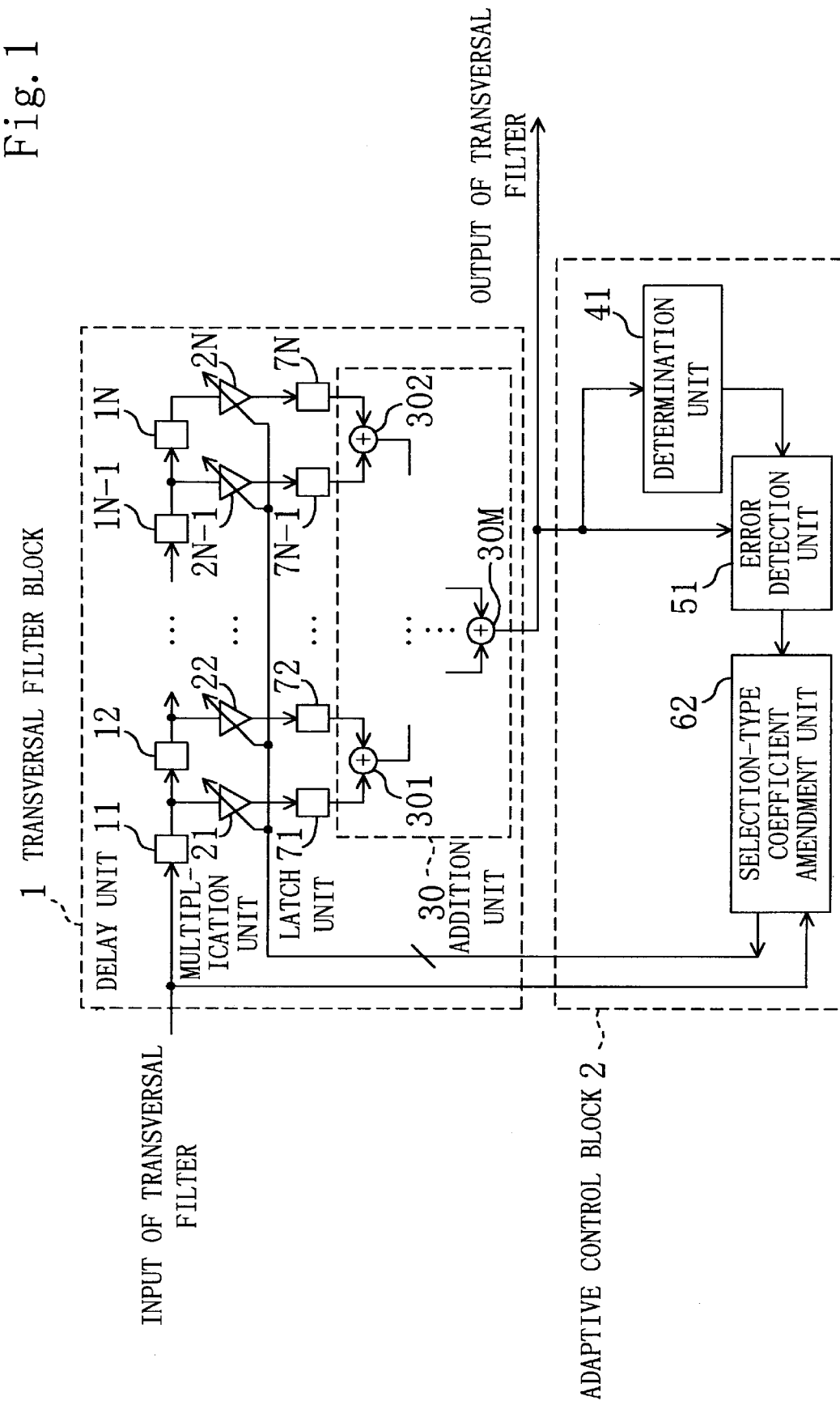
FIG. 1 shows the entire structure of the adaptive auto equalizer of the first embodiment of the present invention.

FIG. 1 show the entire structure of an adaptive auto equalizer which comprises a transversal filter block 1 and an adaptive control block 2. The transversal filter block 1 includes delay units 11, 12, 1N-1 and 1N, multiplication units 21, 22, 2N-1, and 2N, latch units 71, 72, 7N-1, and 7N, and an addition unit 30 consisting of a plurality of adders 301, 302, and 30M. The adaptive control block 2 includes a determination unit 41, an error detection unit 51, and a selection-type coefficient amendment unit 62 which features the present invention. The selection-type coefficient amendment unit 62, as detailed in FIG. 3, includes coefficient modification units 621, 622, and 62N for taps 1 to N each having a plurality of latch units (weight coefficient holding units) for storing weight coefficients to be given to a corresponding one of the multiplication units 21 to 2N.

The transversal filter block 1 is a well-known FIR (Finite Impulse Response) filter, and the delay units 11 to 1N serially delay an input signal and output delayed signals to the multiplication units 21 to 2N, respectively. Each of the multiplication units 21 to 2N multiplies the delayed signal with the weight coefficient given from the adaptive control block 2. The addition unit 30 serially adds the multiplication results of the multiplication units 21 to 2N together and outputs the sum to outside. The latch units 71, 72, 7N−1, and 7N are disposed between the multiplication units 21 to 2N and the addition unit 30 in order to output data accurately during a high-rate operation.

In the adaptive control block 2, the determination unit 41 compares the output of the transversal filter block 1 (the output of the adder 30M) with a predetermined threshold value so as to determine and output the expected value of the output signal. The error detection unit 51 detects the error between the output of the transversal filter block 1 and the expected value determined in the determination unit 41. The selection-type coefficient amendment unit 62 modifies the weight coefficients to be given to the multiplication units 21 to 2N in the transversal filter block 1, by using the error value detected by the error detection unit 51.

In the transversal filter block 1, a delay amount before the output of a signal occurs in each of the multiplication units 21, 22, 2N−1, and 2N, the latch units 71, 72, 7N−1, and 7N, and the addition unit 30. Also in the adaptive control block 2, a delay amount before the amendment of a weight coefficient occurs in each of the determination unit 41, the error detection unit 51, and the selection-type coefficient amendment unit 62. In the conventional adaptive equalizer, a delay amount is not ideally taken into consideration for the coefficient amendment, so that the occurrence of such a delay amount leads to the amendment of a wrong weight coefficient. In contrast, the selection-type coefficient amendment unit 62 of the present embodiment amends weight coefficients by taking the above-mentioned delay amount into consideration.

Figure 2:
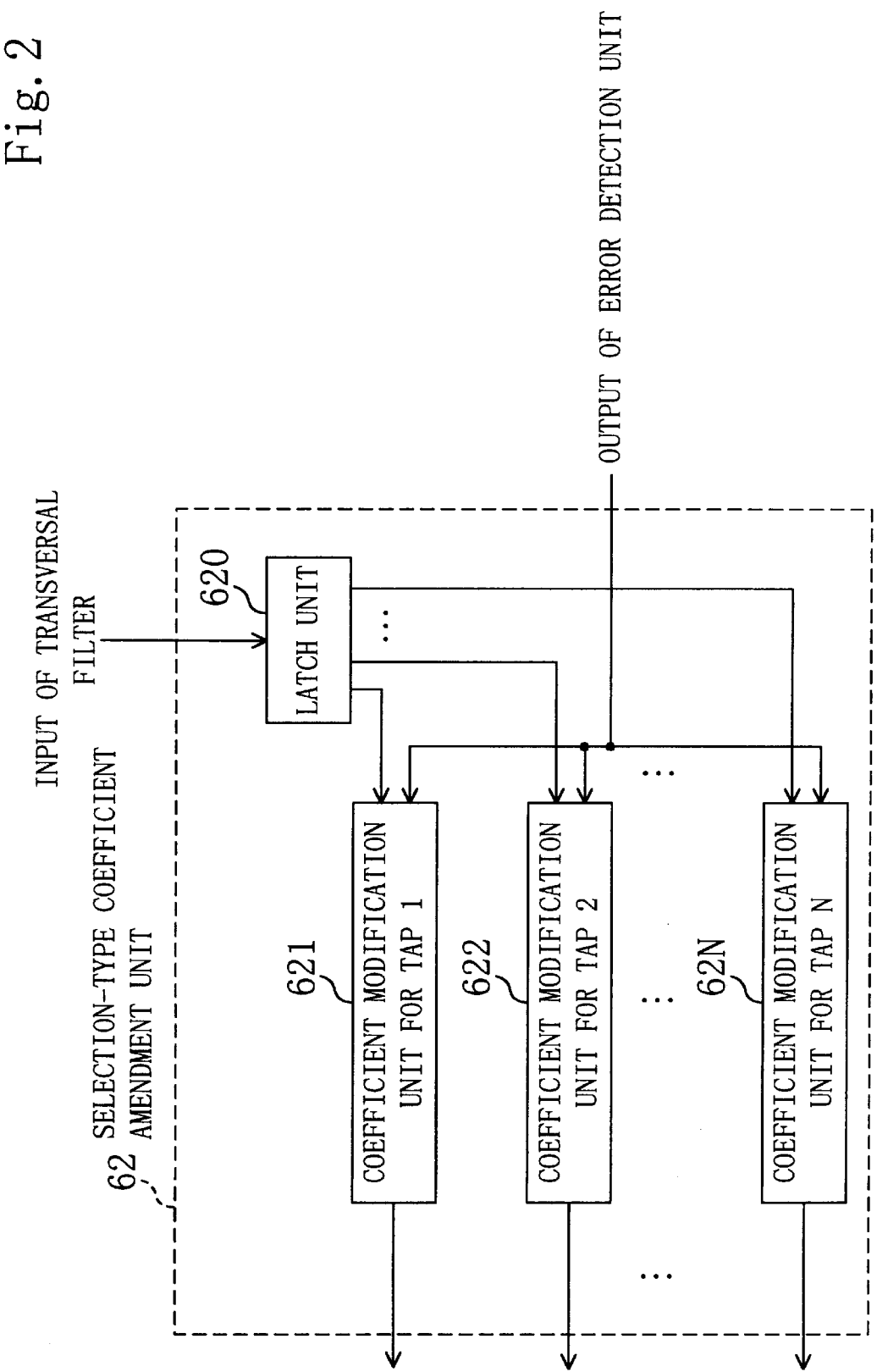
FIG. 2 shows the internal structure of the selection-type coefficient amendment unit of the first embodiment.

The internal structure of the selection-type coefficient amendment unit 62 is shown in FIG. 2. This unit 62 includes a latch unit 620, coefficient modification units 621, 622, and 62N which correspond to tap 1 (multiplication unit 21), tap 2 (multiplication unit 22), and tap N (multiplication unit 2N), respectively. The latch unit 620 delays a signal entered to the transversal filter block 1 in the same manner as the delay units 11 to 1N included in the transversal filter block 1, so as to correspond delayed signals to the coefficient modification units 621 to 62N, respectively. Each of the coefficient modification units 621 to 62N for taps 1 to N enters a corresponding one of the delayed signals from the latch unit 620 and the output (detected error) of the error detection unit 51 shown in FIG. 1, and modifies the weight coefficient to be given to a corresponding one of the multiplication units, based on the delayed signal and the output.

Figure 3:
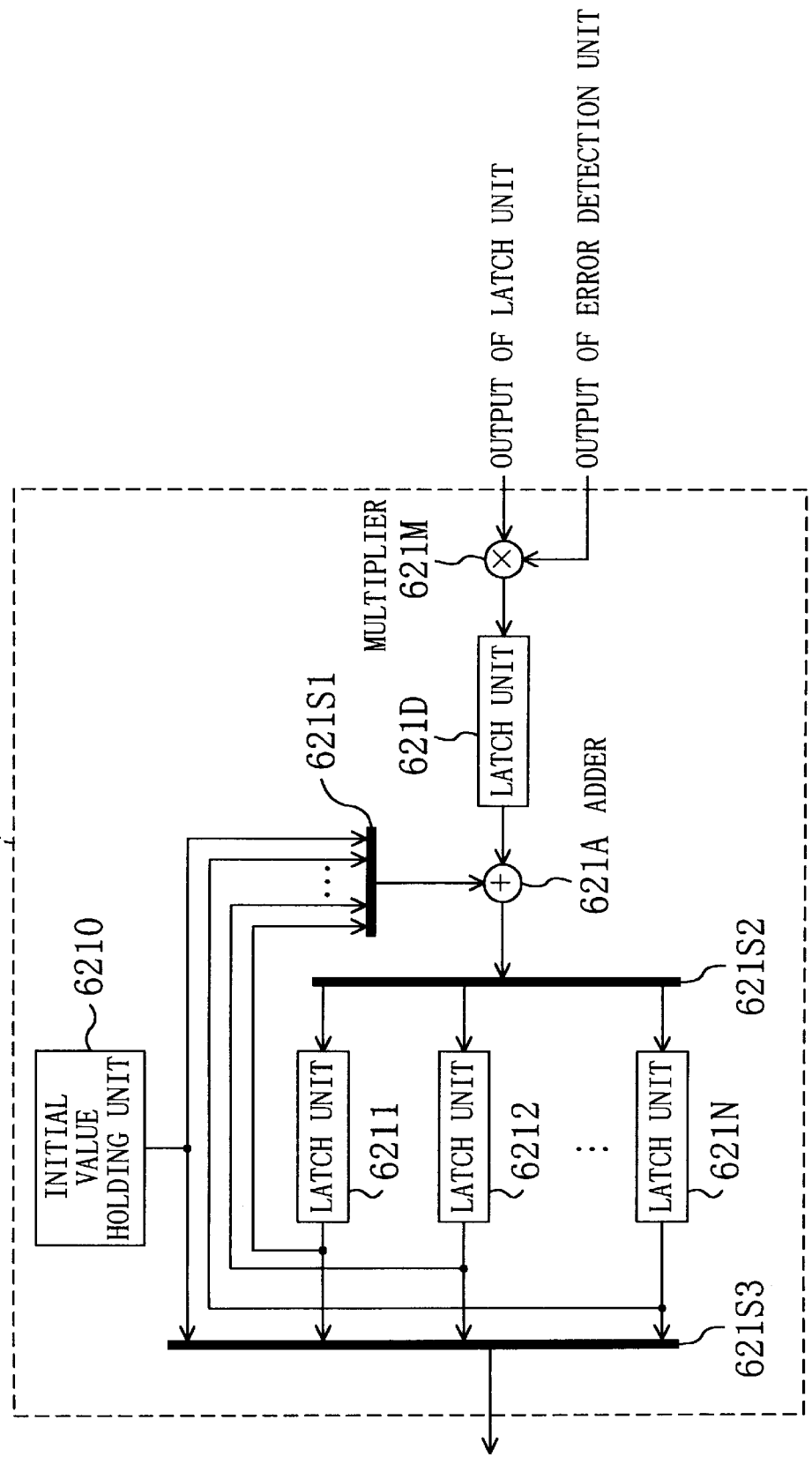
FIG. 3 shows the internal structure of the coefficient modification unit for a tap of the first embodiment.

The coefficient modification units 621, 622, and 62N for taps 1 to N have the same structure. The internal structure of the coefficient modification unit 621 for tap 1 is shown in FIG. 3. This unit 621 includes an initial value storage unit 6210 for storing the initial value of a weight coefficient, a plurality (N) of latch units (weight coefficient holding units) 6211, 6212, and 621N for storing serially updated weight coefficients, an adder 621A, a latch unit 621D, a multiplier 621M, and selectors 621S1, 621S2, and 621S3.

In the coefficient modification unit shown in FIG. 3, the multiplier 621M multiplies the output of the latch unit 620 shown in FIG. 2 with the output of the error detection unit 51 shown in FIG. 1. This multiplication result is latched by the latch unit 621D. The selector 621S1 first selects the initial weight coefficient of the initial value storage unit 6210 and then selects the updated weight coefficients held in the plurality of latch units 6211 to 621N one by one. The adder 621A adds the multiplication result latched by the latch unit 621D to the weight coefficient selected in the selector 621S1 so as to further update the weight coefficient. The selector 621S2 selects the plurality of latch units 6211 to 621N one by one. Consequently, the weight coefficient newly calculated by the adder 621A is stored in the latch unit selected by the selector 621S2. The selector 621S3 selects one of the plurality of latch units 6211 to 621N in descending order from the top in the drawing, and outputs the weight coefficient of the selected latch unit to a corresponding one of the multiplication units 21, 22, and 2N shown in FIG. 1.

Figure 4:
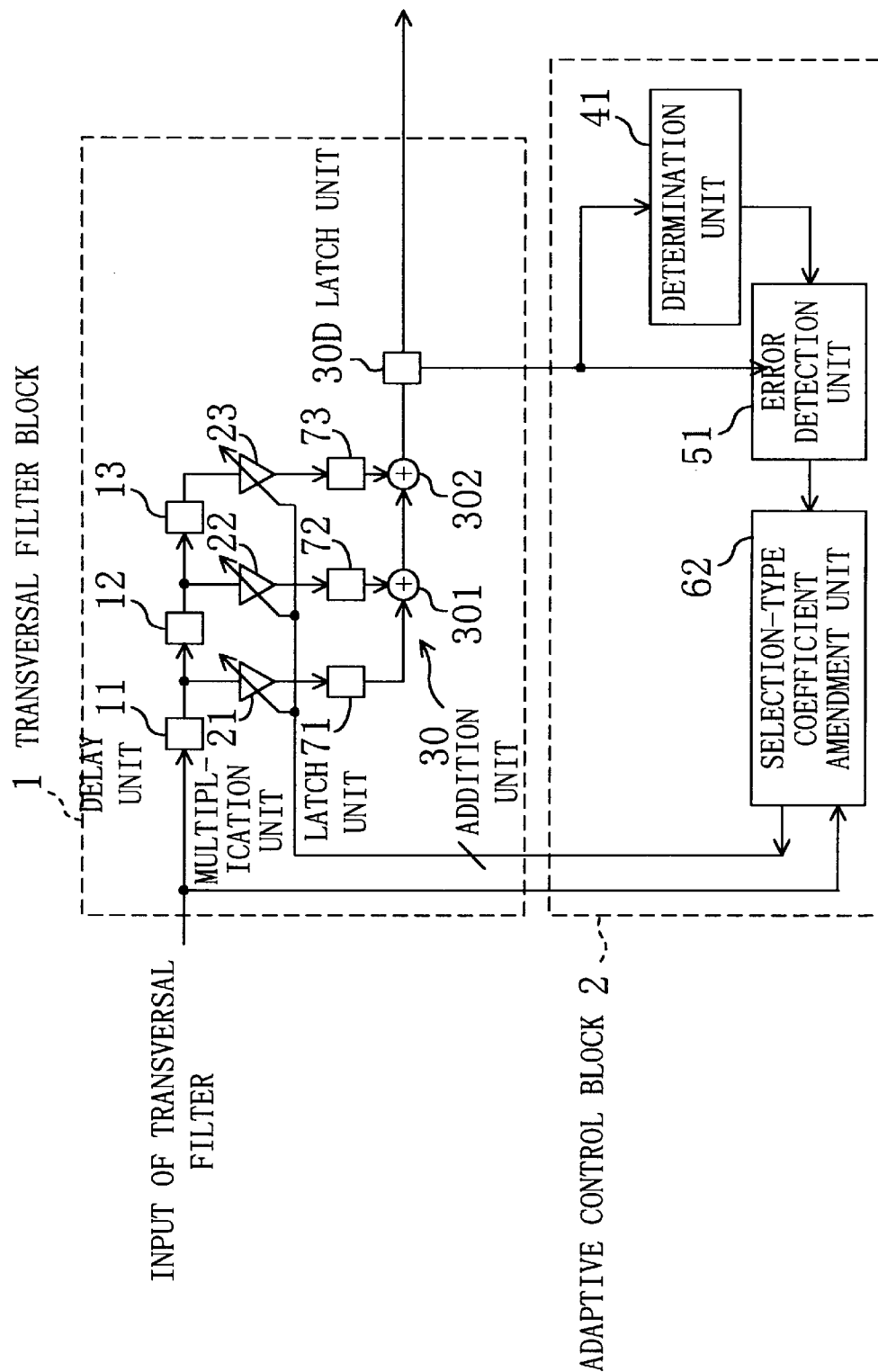
FIG. 4 shows the entire structure of the adaptive auto equalizer when the tap number is 3 in the first embodiment.

FIG. 4 shows the case where the number of taps (the number of multiplication units) of the transversal filter block 1 is 3. The structure of the selection-type coefficient amendment unit 62 and the coefficient amendment unit for a tap in this case are shown in FIGS. 5 and 6, respectively.

Figure 6:
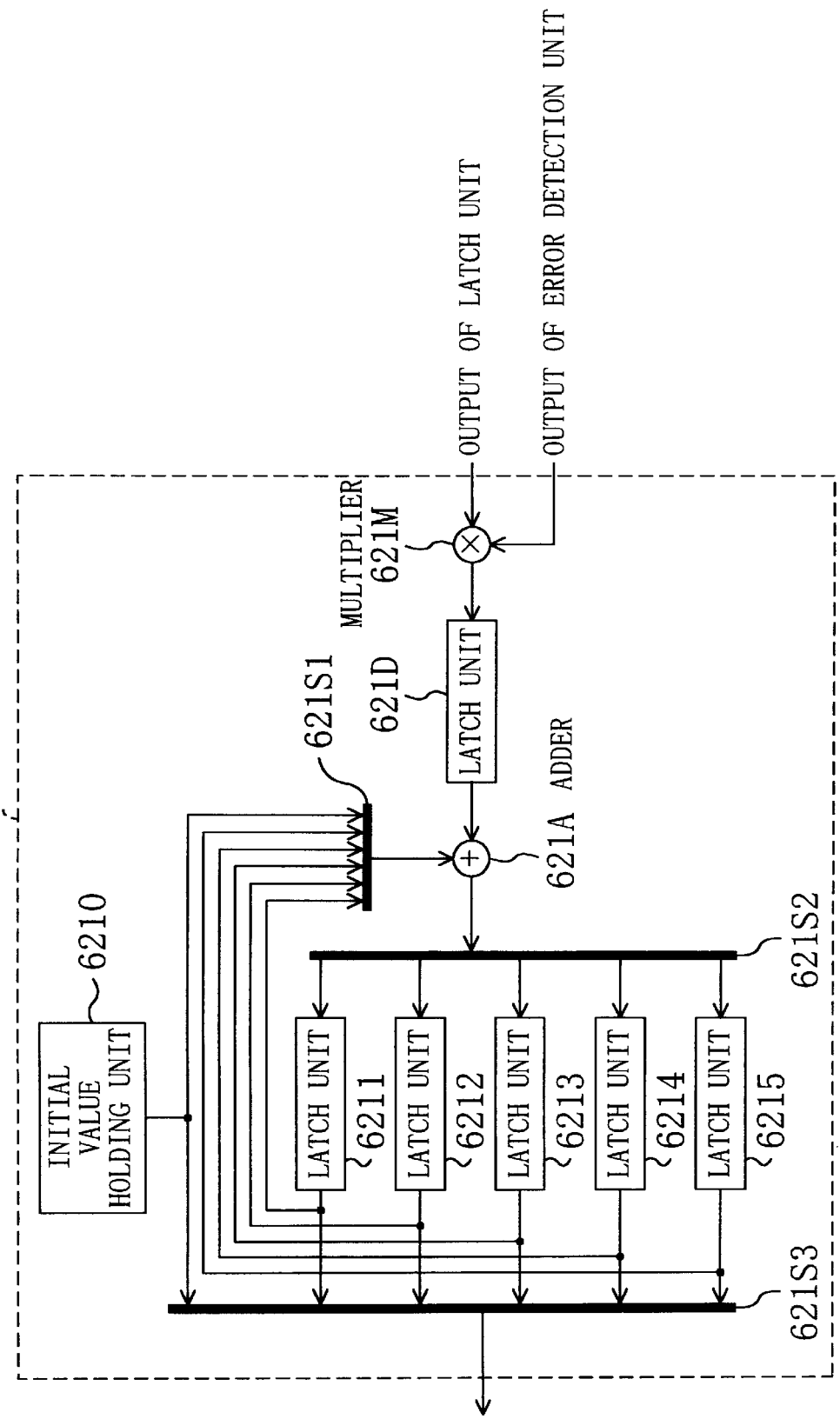
FIG. 6 shows the internal structure of the coefficient modification unit for a tap of the first embodiment.

In FIG. 6, the calculation delay amount in the transversal filter block 1 (or the sum of each delay amount of the multiplication units, the latch units, and the addition unit) corresponds to the number of stages of the latch units provided in the transversal filter block 1, that is, two stages of the latch units 71 to 73 and the latch unit 30D. In FIG. 6, the amendment delay amount of a weight coefficient in the adaptive control block 2 (or the total of each delay amount of the determination unit 41, the error detection unit 51, and the selection-type coefficient amendment unit 62) corresponds to three stages: an unillustrated latch unit included in the error detection unit 51, latch unit 621D included in the coefficient modification unit, and latch units (weight coefficient holding units) 6211 to 6215. Consequently, the number of latch units (weight coefficient holding units) to be provided in the coefficient modification unit for a tap is 5.

Figure 5:
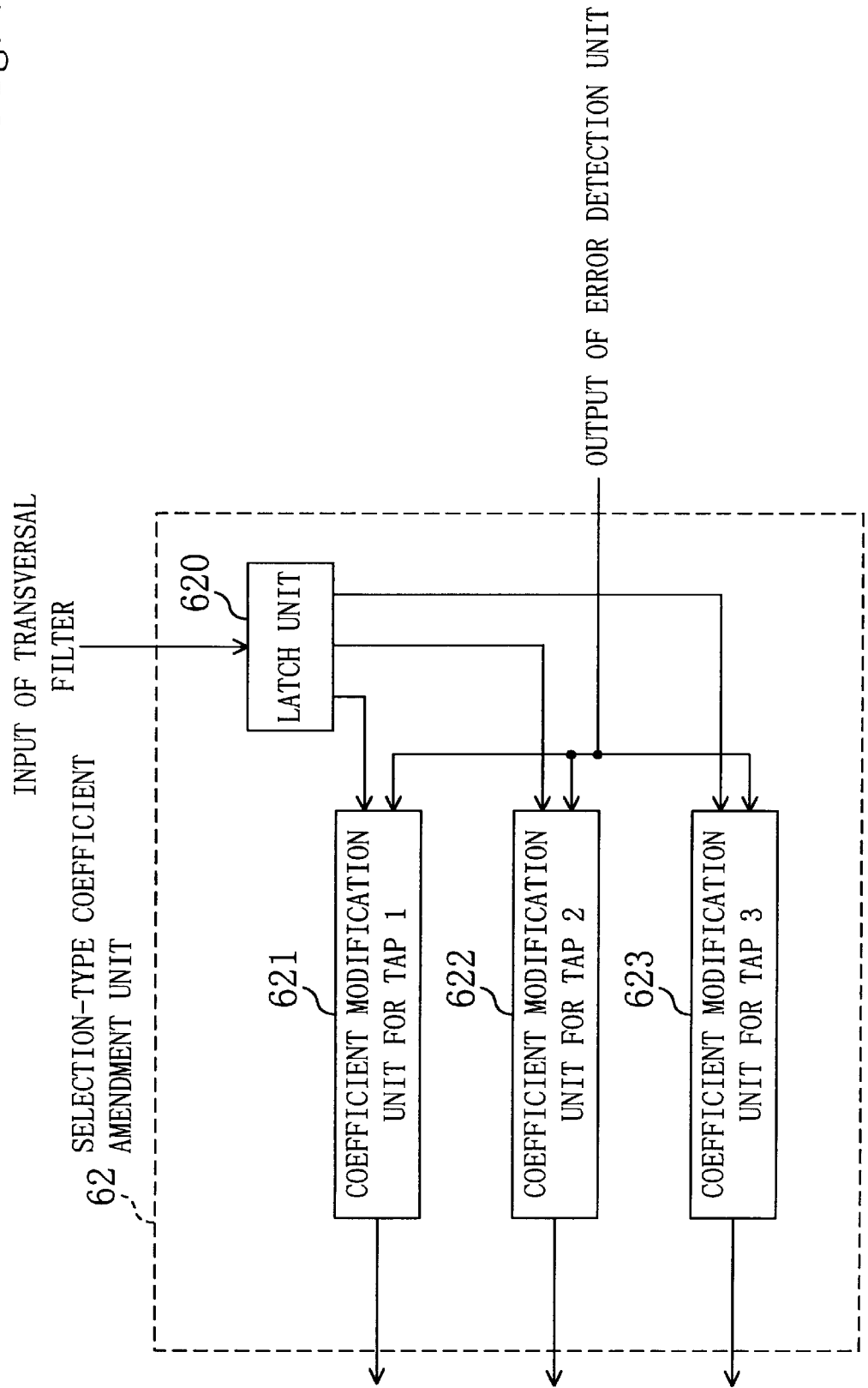
FIG. 5 shows the internal structure of the selection-type coefficient amendment unit of the first embodiment.
Figure 7:
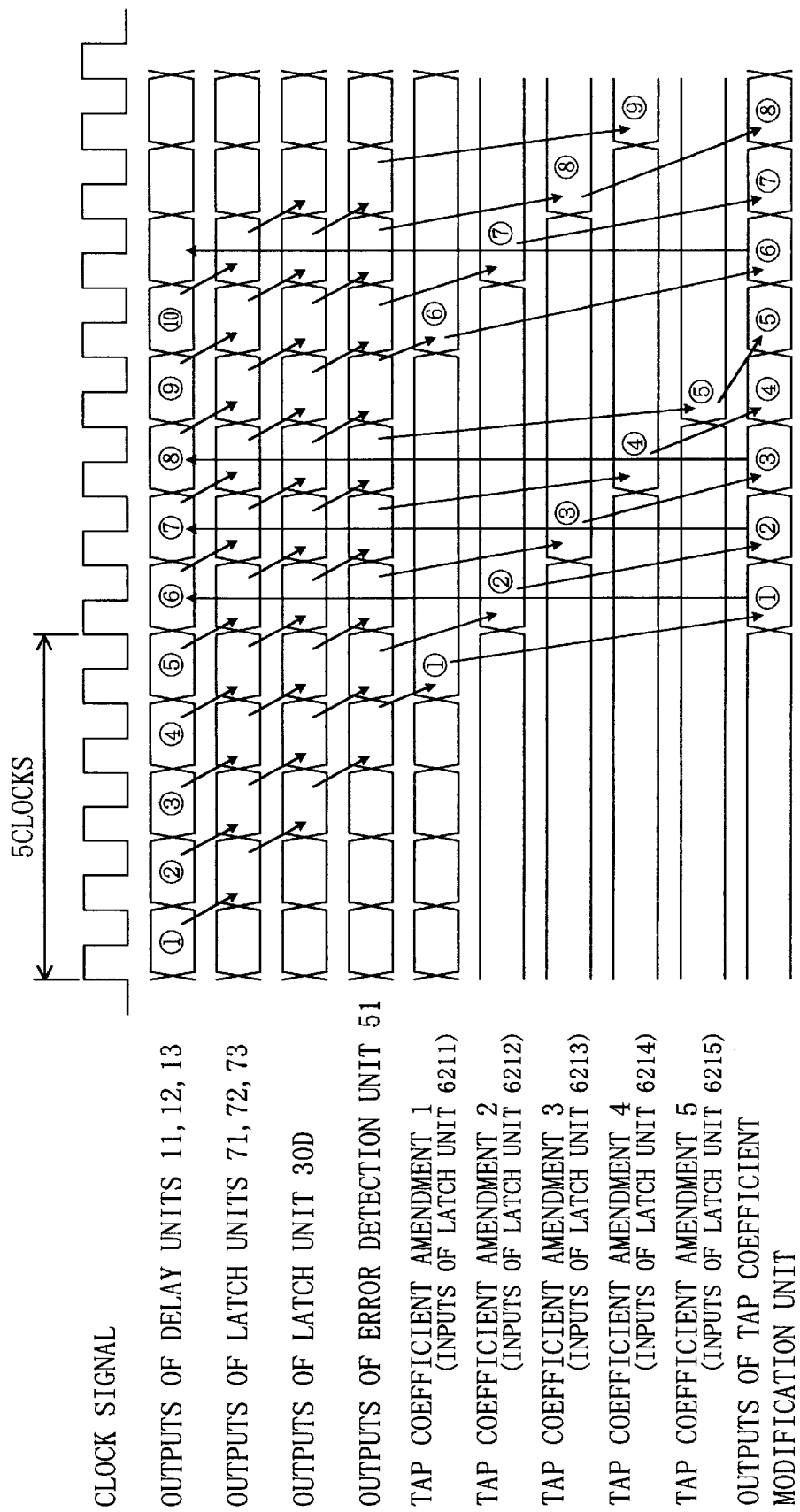
FIG. 7 shows the timing chart of the first embodiment.

FIG. 7 shows the operational timing chart of the adaptive auto equalizer which has the structure shown in FIGS. 4, 5, and 6. The chart includes the outputs of the delay units 11, 12, and 13, the outputs of the latch units 71, 72, and 73, and the outputs of the latch unit 30D, the outputs of the error detection unit 51, the inputs of the latch units (weight coefficient holding units) 6211 to 6215, and the outputs of the selector 621S3 (or the outputs of the coefficient modification units for taps).

The following description will be focused on five distorted signals which are consecutively entered to the transversal filter block 1 (the outputs of the delay units are assigned with ① to ⑤ in FIG. 7). As shown in the chart, in the adaptive auto equalizer of the present embodiment, when these signals ① to ⑤ are entered and 5 clocks have passed since the entering of each of these signals, the weight coefficient calculated and updated based on each of the signals is outputted from each of the coefficient modification units 621 to 623 for taps 1 to 3 of the adaptive control block 2. Thus, the calculation delay amount of a weight coefficient in this adaptive auto equalizer is 5 clocks. However, for example, in the coefficient modification unit 621 of the multiplication unit 21, the weight coefficient based on the signal ① is stored in the latch unit (weight coefficient holding unit) 6211 after having been calculated and updated in the adder 621A. When another 1 clock has passed, the selector 621S2 makes the weight coefficient based on the signal ② be stored to the latch unit (weight coefficient holding unit) 6212 through the adder 621A. Hereafter, every time 1 clock passes, the weight coefficient based on each of the signals ③ to ⑤ is stored in the latch units (weight coefficient holding units) 6213 to 6215, respectively. Thus, the weight coefficient of each latch unit (weight coefficient holding unit) is modified every 4 clocks. The weight coefficients of these latch units are serially held in the latch units and also selected by the selector 621S3 to be given to the multiplication unit 21. As a result, as indicated in the chart, when the signal (assigned with ⑥ in the chart) which comes 5 clocks after the signal ① is entered, the weight coefficient of the latch unit 6211 based on the signal ① is given to the multiplication unit 21. In the same manner, when the signals (assigned with ⑦ to ⑩ in the chart) which come 5 clocks after the signals ② to ⑤, respectively are entered, the weight coefficients based on the signals ② to ⑤, respectively are given to the multiplication unit 21. Consequently, as the chart indicates, each weight coefficient can be properly amended and updated while weight coefficients to be given from the coefficient modification units to the multiplication units are updated every clock and the time delay (5 clocks) required for the calculation and update of the weight coefficient is taken into consideration. As a result, the output of the transversal filter block 1 can be converged upon the expected value at an early stage, which improves the convergence.

As described hereinbefore, each multiplication unit is provided with a plurality of latch units (weight coefficient holding units) for storing the weight coefficients to be given to the multiplication unit, and the weight coefficients stored in these latch units are updated every time the delay time period required for amending a weight coefficient passes, at the interval of 1 time period (predetermined time) of a clock signal, and these factors are selected at the interval of the predetermined time period. Therefore, the output error of the adaptive auto equalizer does not diverge, which secures to obtain ideal output signals in a stable manner.

EMBODIMENT 2

The adaptive auto equalizer of the second embodiment of the present invention will be described as follows.

Figure 8:
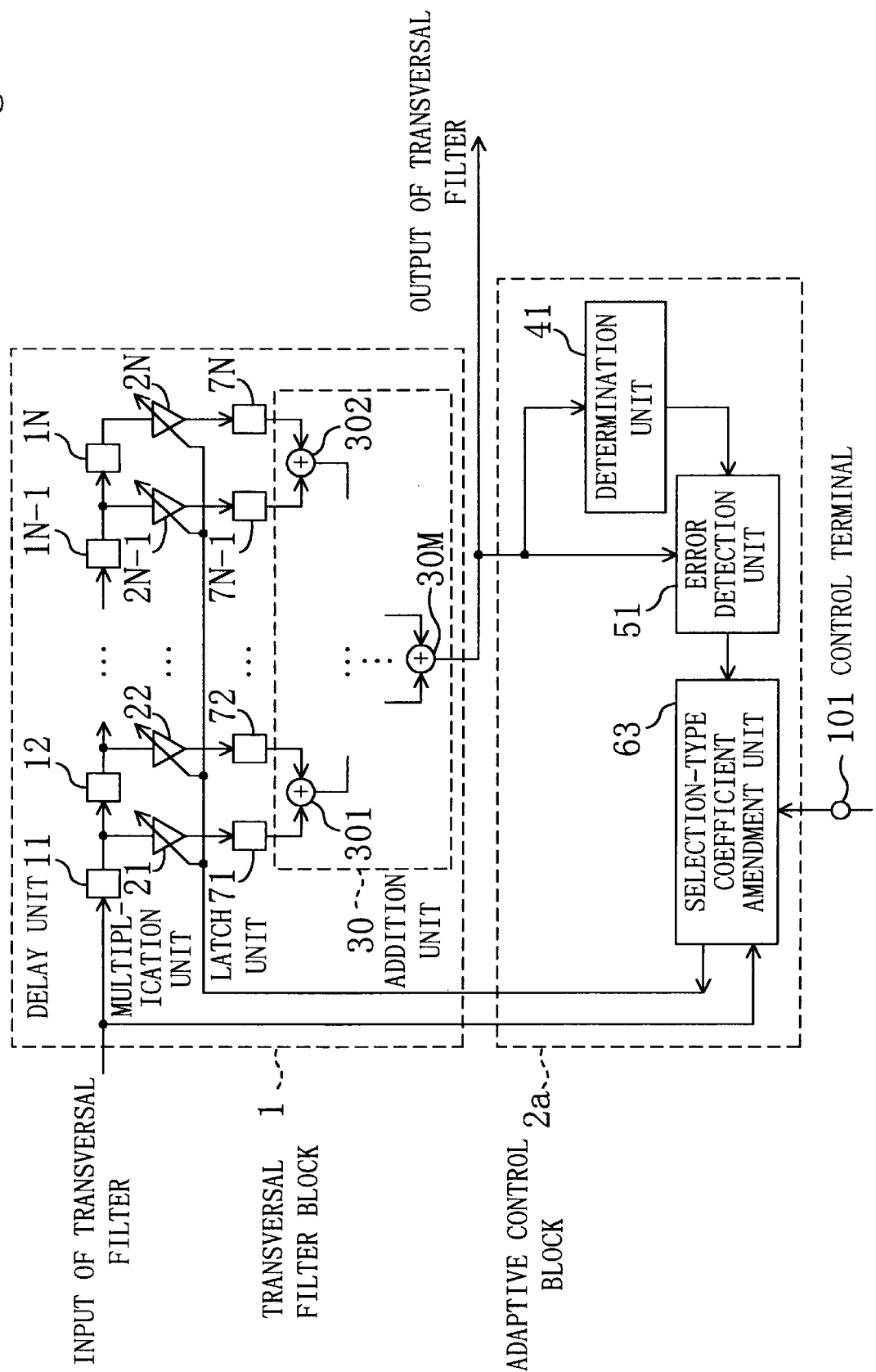
FIG. 8 shows the entire structure of the adaptive auto equalizer of the second embodiment of the present invention.

FIG. 8 shows the structure of the adaptive auto equalizer of the present embodiment. The present embodiment is different from the first embodiment only in that the selection-type coefficient amendment unit 63 in the adaptive control block 2a includes a control terminal 101 for entering a control signal. The control signal designates the number of required latch units of the plurality of latch units (weight coefficient holding units) provided in the selection-type coefficient amendment unit 63, according to the calculation delay amount of a weight coefficient. The selection-type coefficient amendment unit 63 controls the three selectors 621S1 to 621S3 included in the coefficient amendment unit whose internal structure is shown in FIGS. 2 and 3. Since the other structures and basic operations of the present embodiment are equal to those of the first embodiment, the same elements are assigned with the same reference numbers and their description will be omitted.

Thus, in the present embodiment, the number of necessary latch units can be designated by means of the control signal. Consequently, even if the delay time periods required before the update of weight coefficients are different due to the difference in the internal structure of the transversal filter block 1 or adaptive control block 2a, the adaptive control block 2a can be used for general purposes, so that there is no need of producing adaptive control blocks in accordance with the internal structure of the transversal filter block 1.

EMBODIMENT 3

The adaptive auto equalizer of the third embodiment of the present invention will be described as follows.

Figure 9:
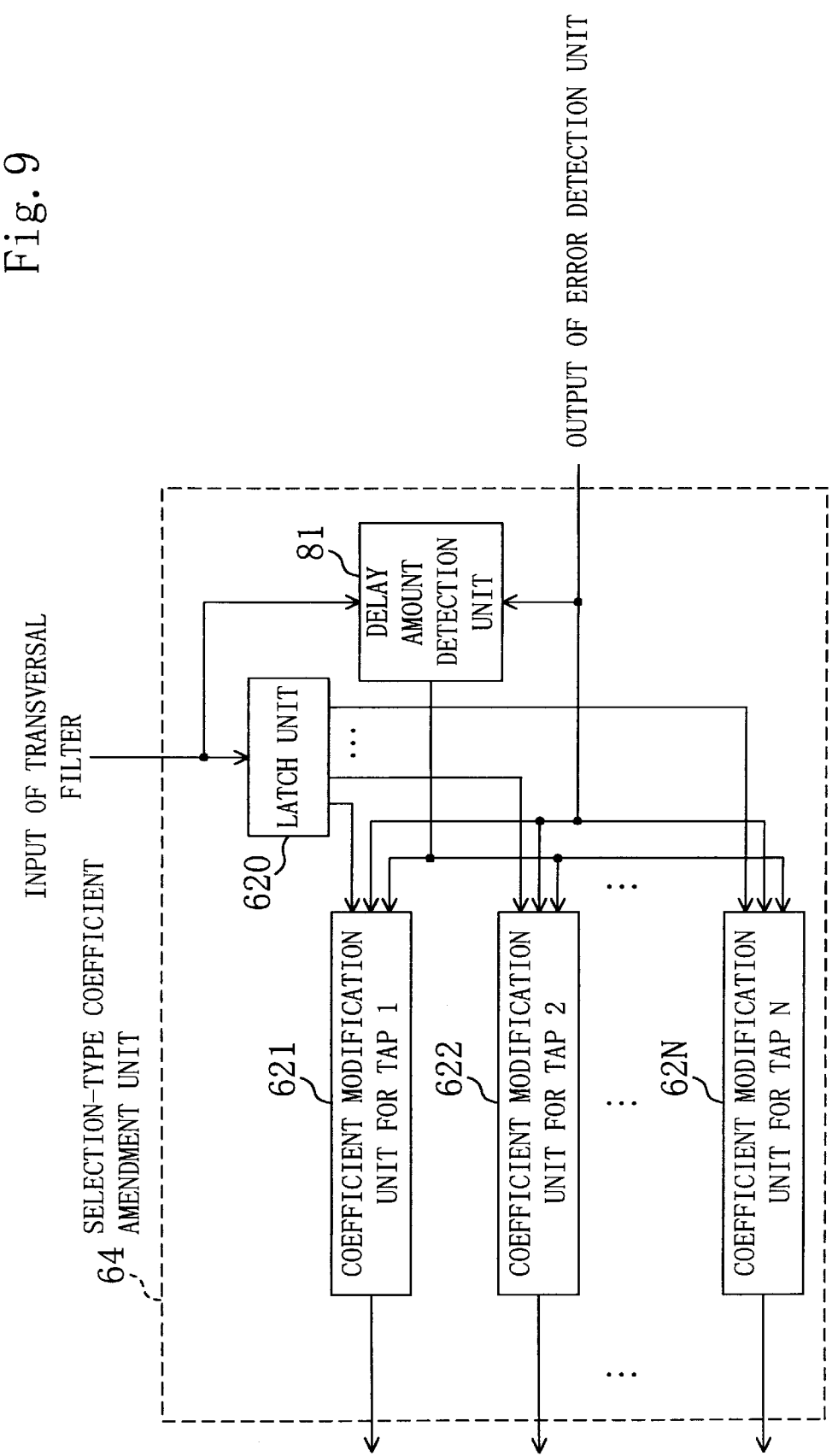
FIG. 9 shows the internal structure of the selection-type coefficient amendment unit of the third embodiment of the present invention.

FIG. 9 shows an internal structure of the selection-type coefficient amendment unit 64 provided in the adaptive auto equalizer of the present embodiment. The selection-type coefficient amendment unit 64 is characterized by including a delay amount detection unit 81 in addition to the internal structure of the selection-type coefficient amendment unit 62 shown in FIG. 2.

The delay amount detection unit 81 detects a delay amount required before the update of a weight coefficient, based on the two signals: the input signal of the transversal filter block 1 and the output signal of the error detection unit 51. The detected signal is entered to each of the coefficient amendment units 621 to 62N for taps 1 to N. Each of the coefficient amendment units 621 to 62N for taps 1 to N designates the number of necessary latch units of the plurality of latch units (weight coefficient holding units) provided therein, depending on the delay amount of the weight coefficient, based on the entered delay amount detection signal.

Thus, the present embodiment also has effects of using the adaptive control block for general purposes in the same manner as the second embodiment.

EMBODIMENT 4

Figure 10:
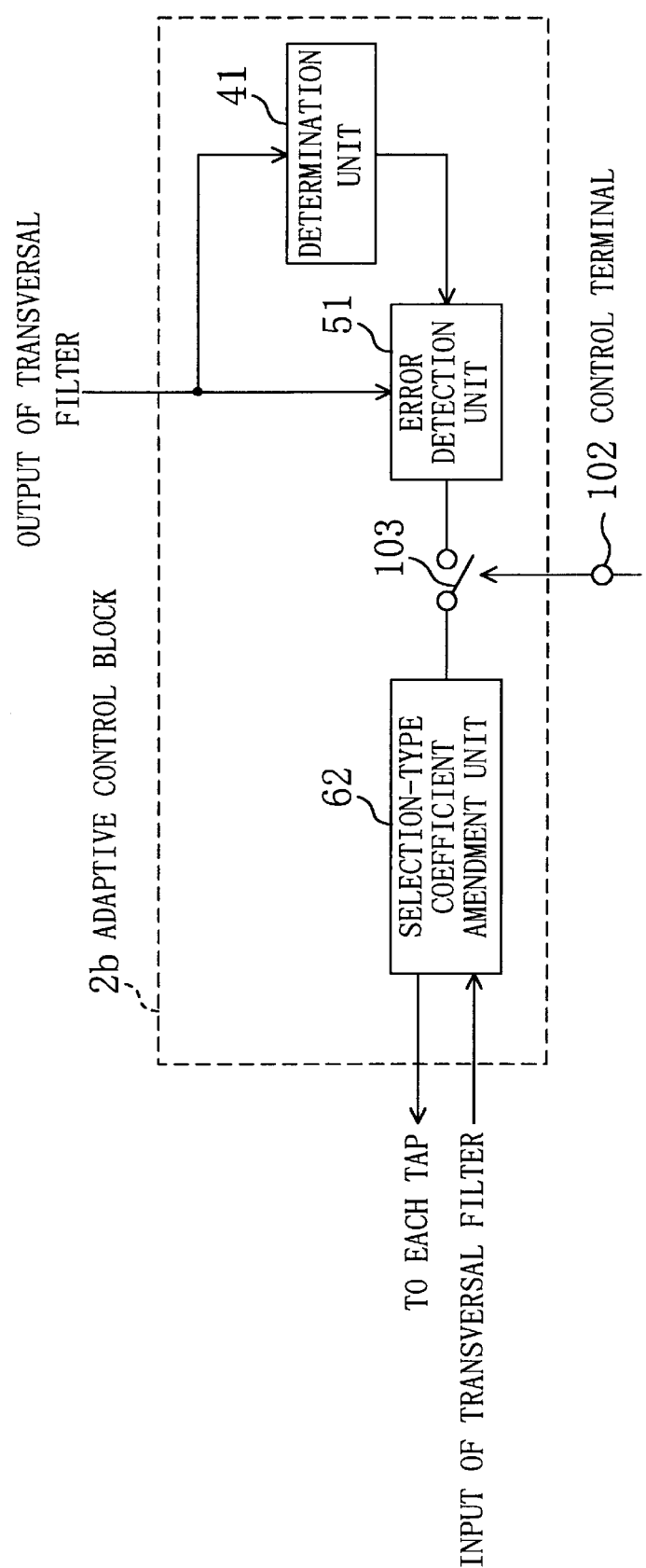
FIG. 10 shows the internal structure of the adaptive control block of the fourth embodiment of the present invention.

In the adaptive auto equalizer of the present embodiment, as shown in FIG. 10, an adaptive control block 2b includes a control terminal 102 for entering a control signal and a switch 103 which is controlled by the control signal. The control signal orders the functions of the adaptive control to be halted serially.

Consequently, the control signal is entered from outside to the control terminal 102 so as to put the switch 103 in the "open" position and to disconnect the error detection unit 51 from the selection-type coefficient amendment unit 62. As a result, the operation of the adaptive control block 2b is put in the "off" state and the functions of the adaptive control are halted. Thus, under the conditions that the output of the transversal filter block 1 is converged upon the expected value or that the adaptive control is unnecessary, it becomes possible to halt the adaptive control so as to reduce powder consumption.

EMBODIMENT 5

Figure 11:
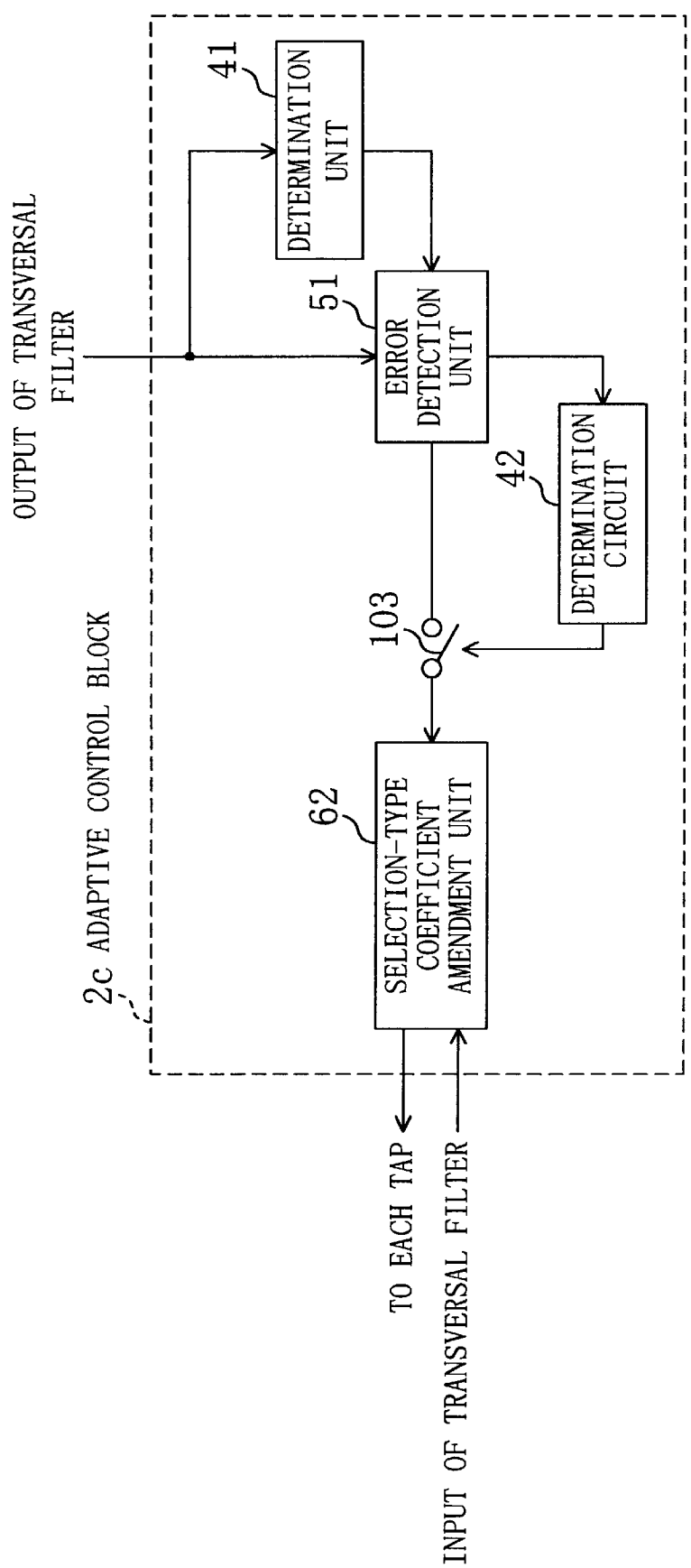
FIG. 11 shows the internal structure of the adaptive control block of the fifth embodiment of the present invention.

In the adaptive auto equalizer of the present embodiment, as shown in FIG. 11, an adaptive control block 2c includes a determination circuit 42 and a switch 103 which receives the output of the determination circuit 42. The determination circuit 42 determines the level of the output of the error detection unit 51, and outputs a control signal for ordering the functions of the adaptive control to be halted serially to the switch 103 when the output level becomes equal to a predetermined value or higher, so as to put the switch 103 in the "open" position. As a result, the operation of the adaptive control block 2c is put in the "off" state and the functions of the adaptive control are halted.

Also when the output of the transversal filter 1 suddenly changes to a great extent due to noise or the like, thereby making the output of the error detection unit 51 large, if a weight coefficient is modified by adaptive control, the coefficient is updated to a value which is far from a desired one. In the present embodiment, however, the determination circuit 42 halts the operation of the adaptive control, so that it becomes possible to perform desired adaptive control by suspending the update of the weight coefficient temporarily.

EMBODIMENT 6

Figure 12:
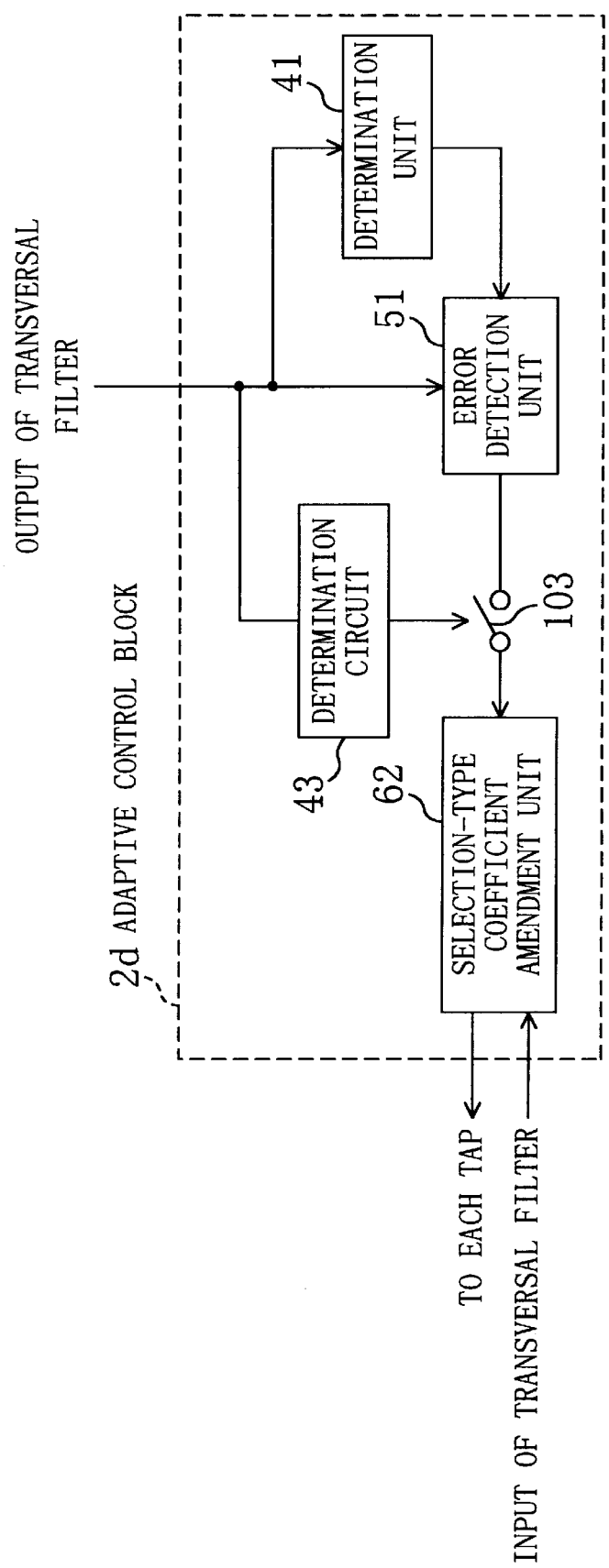
FIG. 12 shows the internal structure of the adaptive control block of the sixth embodiment of the present invention.

In the adaptive auto equalizer of the present embodiment, as shown in FIG. 12, an adaptive control block 2d includes a determination circuit 43 and a switch 103 which receives the output of the determination circuit 43. The determination circuit 43 determines the level of the output of the transversal filter 1, and outputs a control signal for ordering the functions of the adaptive control to be halted serially to the switch 103 when the output level becomes equal to a predetermined value or higher, so as to put the switch 103 in the "open" position and to put the operation of the adaptive control block 2*d* in the "off" state. On the other hand, when the output level of the transversal filter 1 becomes below the predetermined value, the switch 103 is put in the "closed" position, so as to resume the adaptive control.

Thus, in the present embodiment, when the output of the transversal filter 1 suddenly changes to a great extent due to noise or the like, the determination circuit 43 halts the operation of the adaptive control, so as to suspend the update of weight coefficients temporarily, thereby performing desired adaptive control.

EMBODIMENT 7

Figure 13:
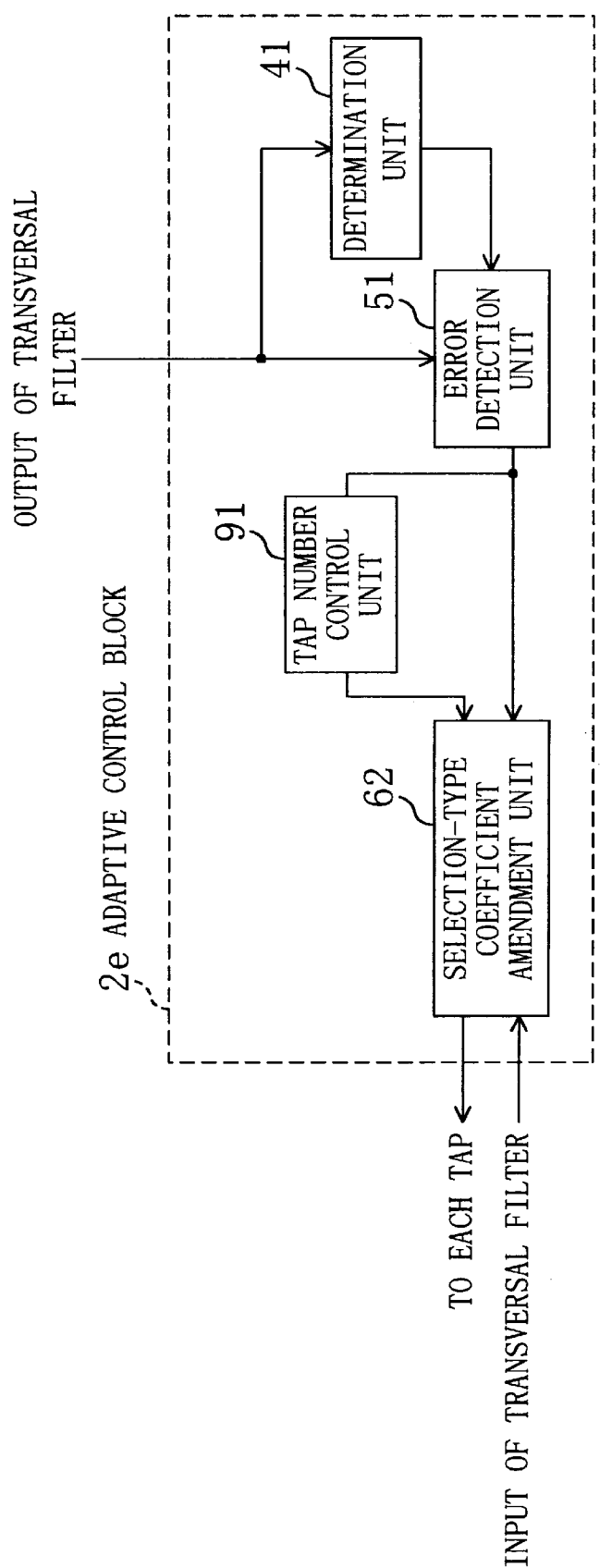
FIG. 13 shows the internal structure of the adaptive control block of the seventh embodiment of the present invention.

In the adaptive auto equalizer of the present embodiment, as shown in FIG. 13, an adaptive control block 2*e* includes a tap number control unit 91. The tap number control unit 91 enters the output of the error detection unit 51, and outputs a control signal to the selection-type coefficient amendment unit 62, so that more multiplication units for updating weight coefficients are used when the output level is large and fewer multiplication units are used when the output level is small.

Consequently, when the error outputted from the error detection unit 51 is small, that is, when the adaptive control does not need to be very accurate, the number of multiplication units for updating weight coefficients can be small, which realizes the reduction of power consumption.

EMBODIMENT 8

Figure 14:
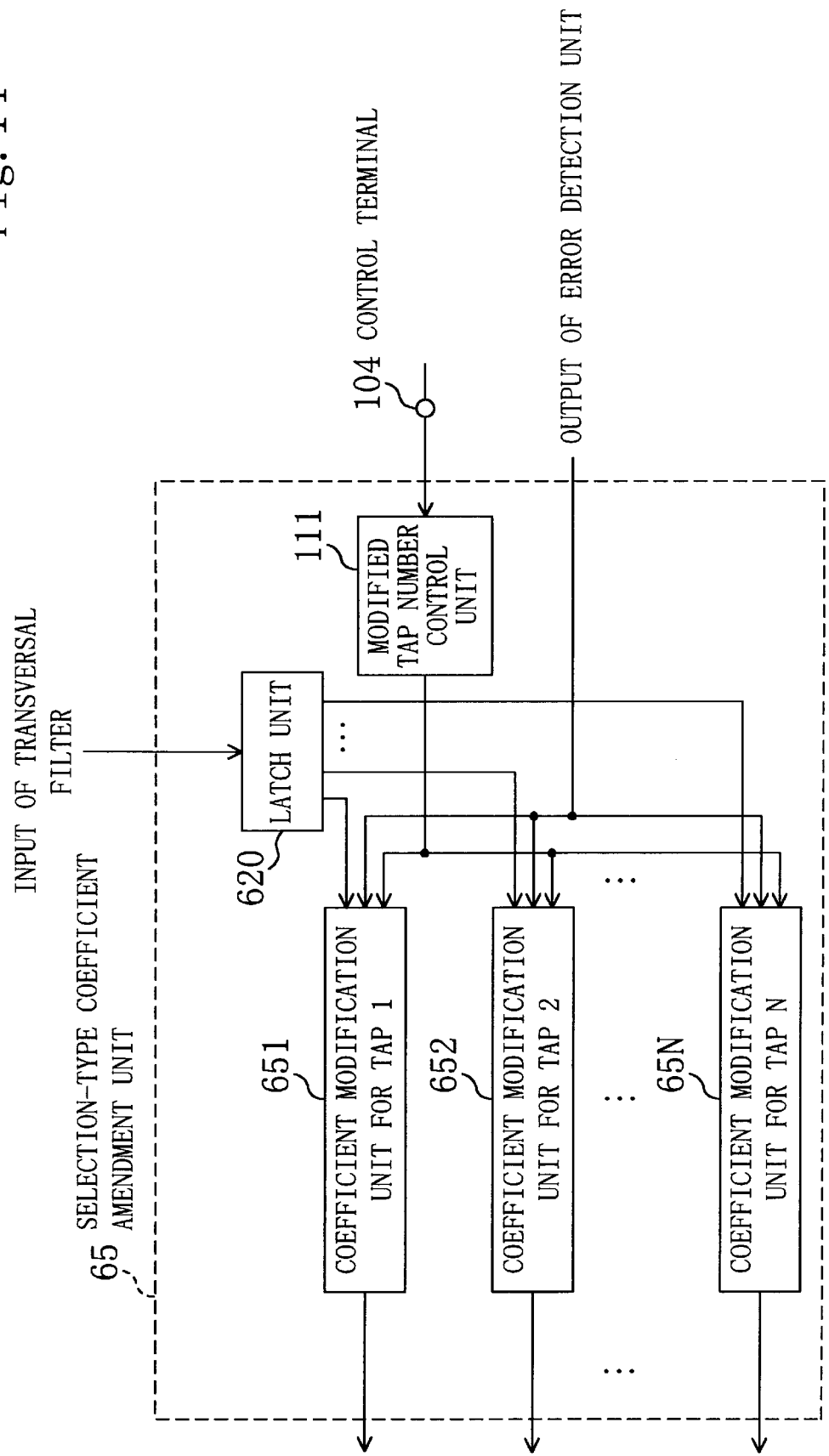
FIG. 14 shows the internal structure of the selection-type coefficient amendment unit of the eighth embodiment of the present invention.

In the present embodiment, as shown in FIG. 14, a selection-type coefficient amendment unit 65 uses an external signal in order to control the number of multiplication units for updating weight coefficients. In short, in FIG. 14, the control signal is entered from outside. to a modified tap number control unit 111 via a control terminal 104. On receiving the external signal, the modified tap number control unit 111 controls the number of coefficient modification units for taps to be used of all the units 651, 652 to 65N contained in the selection-type coefficient amendment unit 65. This restriction of the number of coefficient modification units for taps is conducted by, for example, disconnecting power lines from coefficient modification units for taps not in use by means of a switch or the like. The coefficient modification units for taps to be used are selected to be symmetrical with respect to the one disposed in the center. As a result, power consumption can be reduced for the number of coefficient modification units for taps not in use.

EMBODIMENT 9

Figure 15:
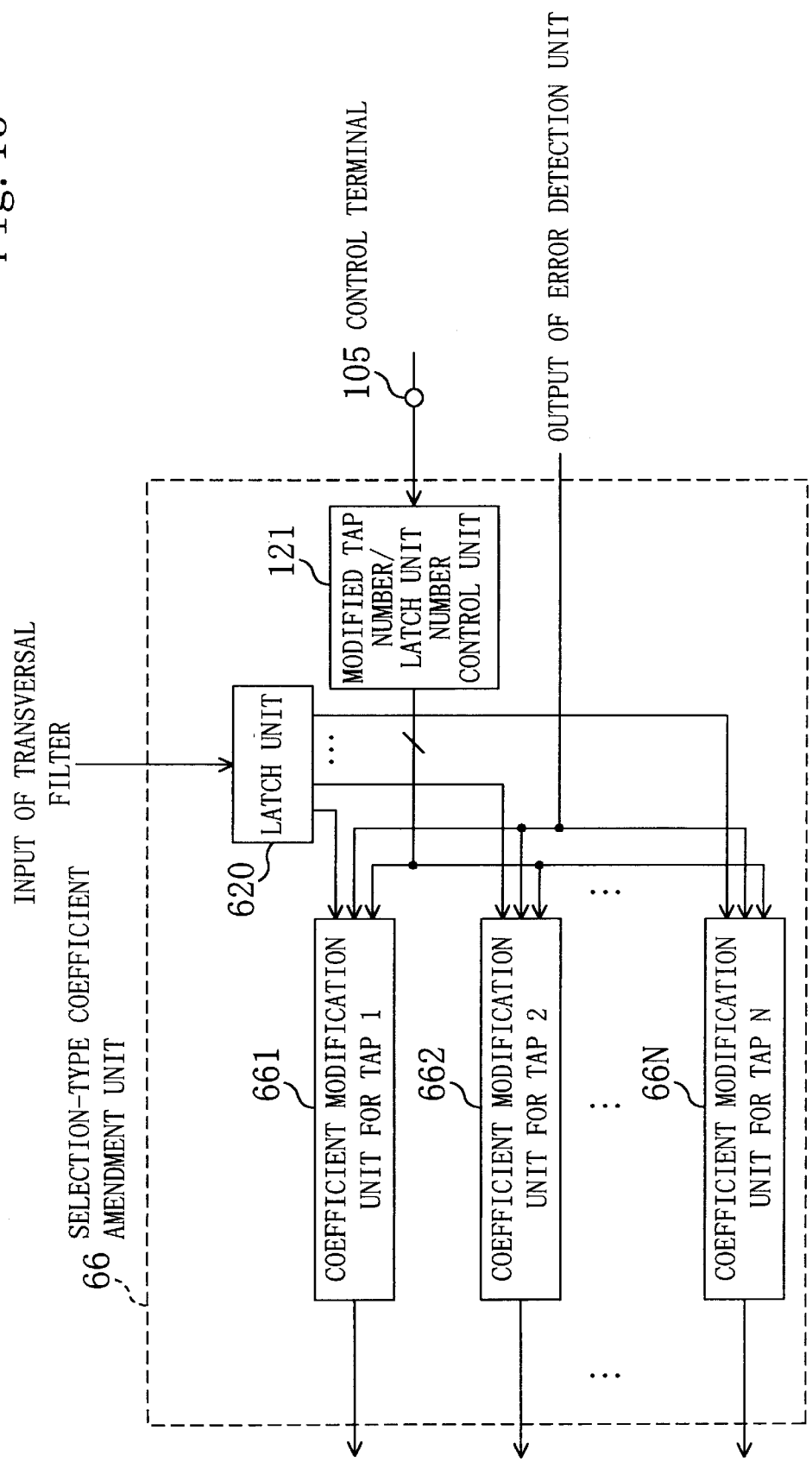
FIG. 15 shows the internal structure of the selection-type coefficient amendment unit of the ninth embodiment of the present invention.

The present embodiment is a combination of the second and eighth embodiments. In other words, as shown in FIG. 15, a selection-type coefficient amendment unit 66 includes a modified tap number/latch unit (weight coefficient holding unit) number control unit 121 which receives an external signal via a control terminal 105. On receiving the external signal, the unit 121 adjusts the number of coefficient modification units for taps to be used, and also adjusts the number of latch units (weight coefficient holding units) to be used in each of the coefficient modification units for taps. As a result, the effects of both the second and eighth embodiments can be obtained.

EMBODIMENT 10

Figure 16:
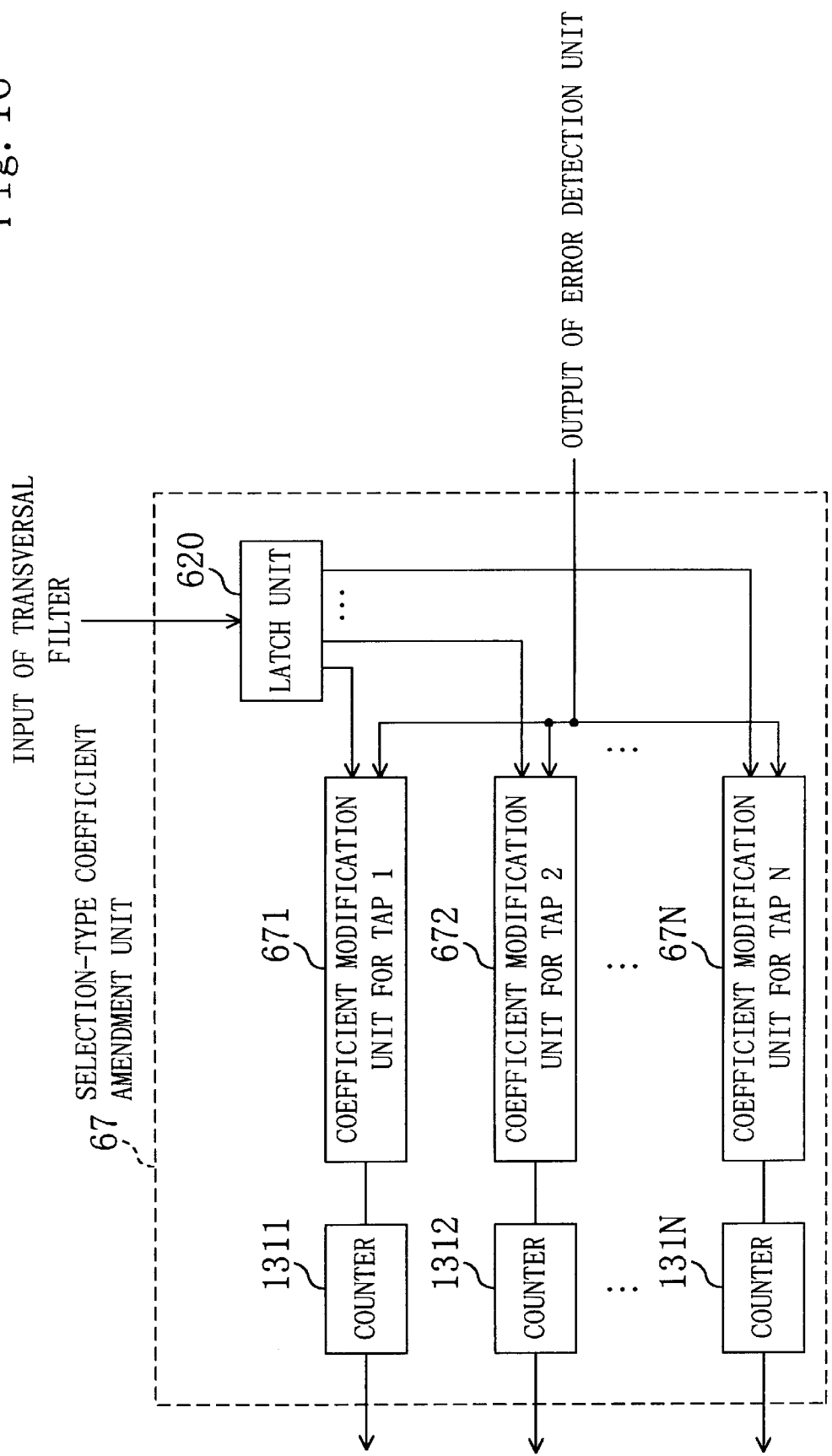
FIG. 16 shows the internal structure of the selection-type coefficient amendment unit of the tenth embodiment of the present invention.

In the present embodiment, as shown in FIG. 16, a selection-type coefficient amendment unit 67 includes counters 1311 to 131N at the stage following the coefficient modification units 671 to 67N for taps 1 to N, respectively. Each of the counters 1311 to 131N counts input clocks, and outputs the output of the corresponding coefficient modification unit for a tap (that is, weight coefficient) when a set value is reached.

Thus, according to the present embodiment, in such a case that the adaptive control does not need to be very accurate, the weight coefficients of the multiplication units can be updated at the interval of a set clock number instead of every clock, which leads to the reduction of power consumption.

EMBODIMENT 11

Figure 17:
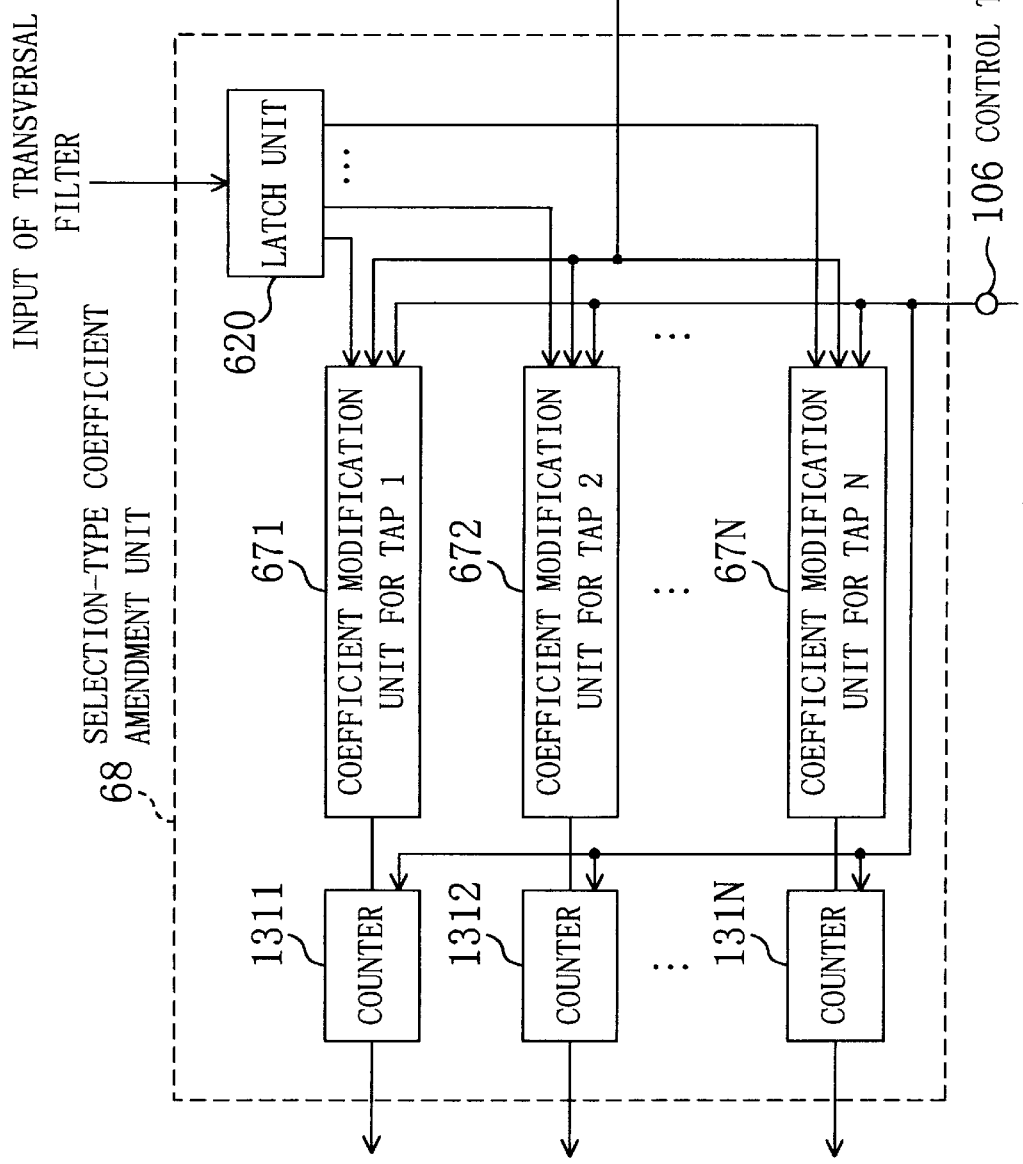
FIG. 17 shows the internal structure of the selection-type coefficient amendment unit of the eleventh embodiment of the present invention.

The present embodiment is an improvement of the tenth embodiment. In a selection-type coefficient amendment unit 68 shown in FIG. 17, an instruction value which indicates the number of internal latch units (weight coefficient holding units) is entered to each of the coefficient modification units 671 to 67N for taps 1 to N from outside via the control terminal 106, and a setting value is entered to each of the counters 1311 to 131N. Consequently, in the same manner as in the ninth and tenth embodiments, it is possible to reduce the power consumption.

EMBODIMENT 12

Figure 18:
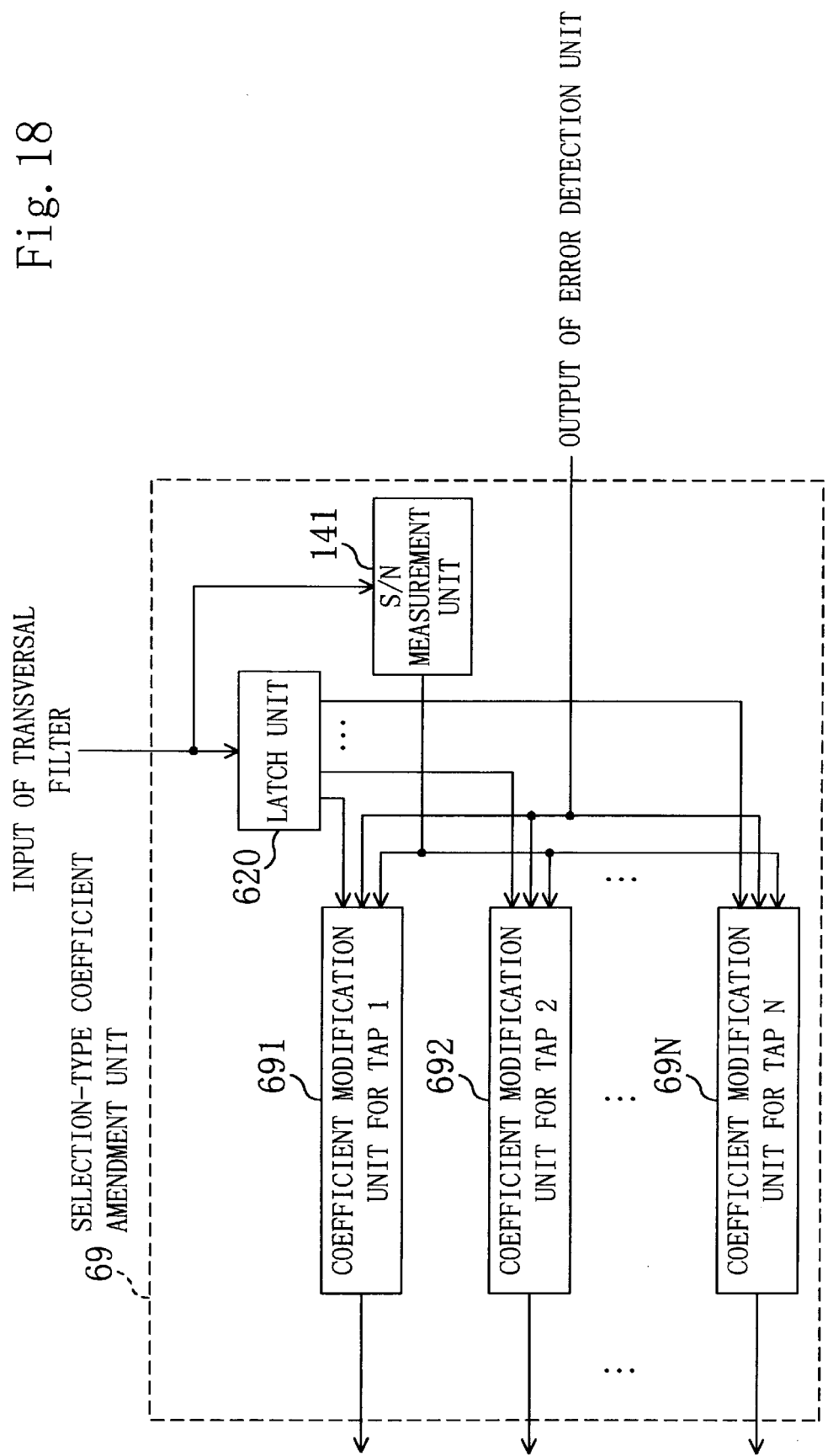
FIG. 18 shows the internal structure of the selection-type coefficient amendment unit of the twelfth embodiment of the present invention.

In the present embodiment, the signal-to-noise ratio of a signal entered to the transversal filter 1 changes depending on the record/reproduction characteristics of data or noise, so that the characteristics of the adaptive equalizer is changed according to the signal-to-noise ratio. In short, as shown in FIG. 18, a selection-type coefficient amendment unit 69 includes a signal-to-noise ratio measurement unit 141. This unit 141 measures the signal-to-noise ratio of an input signal of the transversal filter 1, and decreases the number of coefficient modification units 691, 692 to 69N for taps 1 to N in use when the signal-to-noise ratio is large while increases the same when the ratio is small.

Consequently, according to the present embodiment, even if the signal-to-noise ratio of a signal entered to the transversal filter 1 is small, the number of multiplication units 21 to 2N for updating weight coefficients can be made large, so that the output of the transversal filter 1 can be converged upon the expected value in a short time. On the other hand, when the signal-to-noise ratio is large, the number of tap coefficient modification units in use can be made small so as to reduce the power consumption.

EMBODIMENT 13

Figure 19:
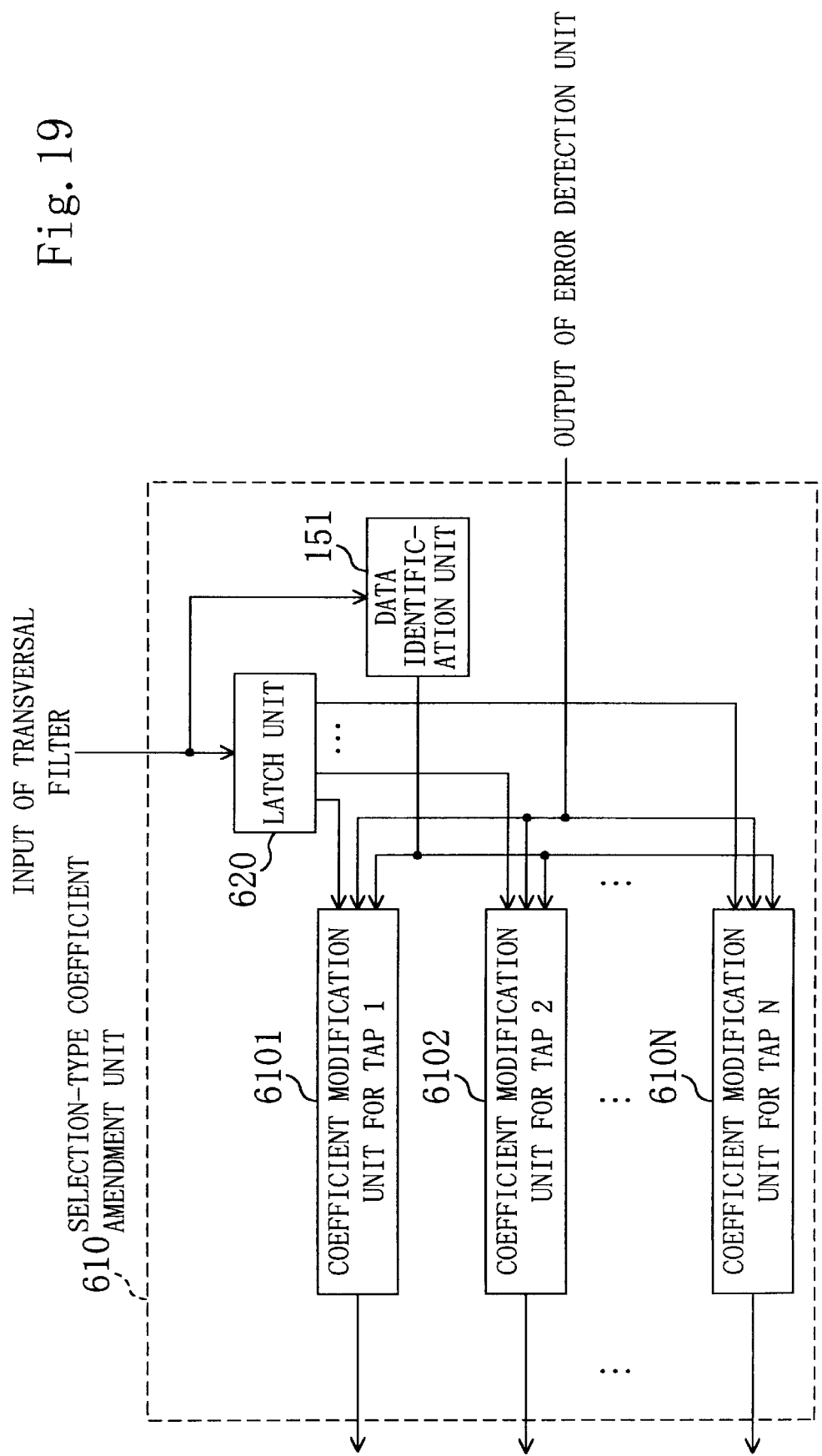
FIG. 19 shows the internal structure of the selection-type coefficient amendment unit of the thirteenth embodiment of the present invention.

In the present embodiment, as shown in FIG. 19, a selection-type coefficient amendment unit 610 includes a data identification unit 151 which receives an input signal of the transversal filter 1. The unit 151 distinguishes the level value or pattern of the input signal of the transversal filter 1, so as to identify the recording medium such as a hard disk or a compact disk, which stores the input signal, and controls the number of coefficient modification units 6101, 6102 to 610N for taps 1 to N to be used, depending on the identification results.

Recording media used for the record/reproduction of data have various data reproduction characteristics depending on their types. In this embodiment, the type of a recording medium is identified based on the signal outputted from the recording medium to the transversal filter 1, and the characteristics of the adaptive equalizer can be changed according to the identification results. As a result, the output of the transversal filter 1 can be converged upon the ideal output value in a short time.

EMBODIMENT 14

Figure 20:
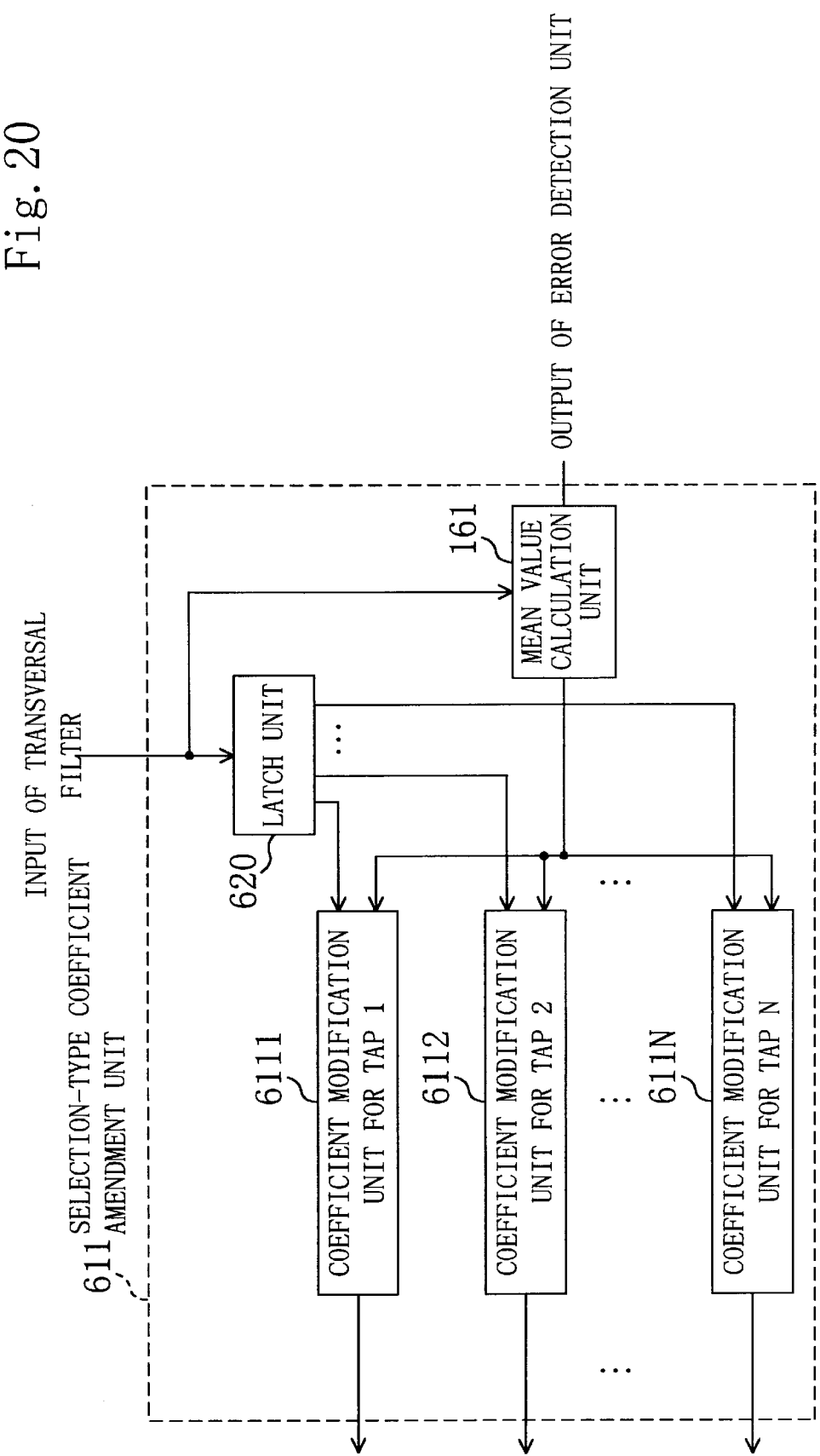
FIG. 20 shows the internal structure of the selection-type coefficient amendment unit of the fourteenth embodiment of the present invention.

In the present embodiment, as shown in FIG. 20, a selection-type coefficient amendment unit 611 includes a mean value calculation unit 161 at the stage preceding the coefficient modification units 6111 to 611N for taps 1 to N. The unit 161 takes an average of the outputs of the error detection unit 51 every clock within a predetermined time period which comes immediately before the entering of the clock. The predetermined time period corresponds, for example, to a time period required for taking a round of the serial output of the weight coefficients of all the coefficient modification units 6111 to 611N for tap 1 to N. The mean error outputted from the mean value calculation unit 161 is entered to each of the coefficient modification units 6111 to 611N for taps 1 to N, thereby being used to update the weight coefficients.

Consequently, according to the present embodiment, even if the outputs of the error detection unit 51 temporarily change to a great extent due to noise or the like, the wrong outputs are not used themselves but are taken an average within a predetermined time period. Thus, it is possible to reduce the wrong update of a weight coefficient to be given to each multiplication unit.

EMBODIMENT 15

Figure 21:
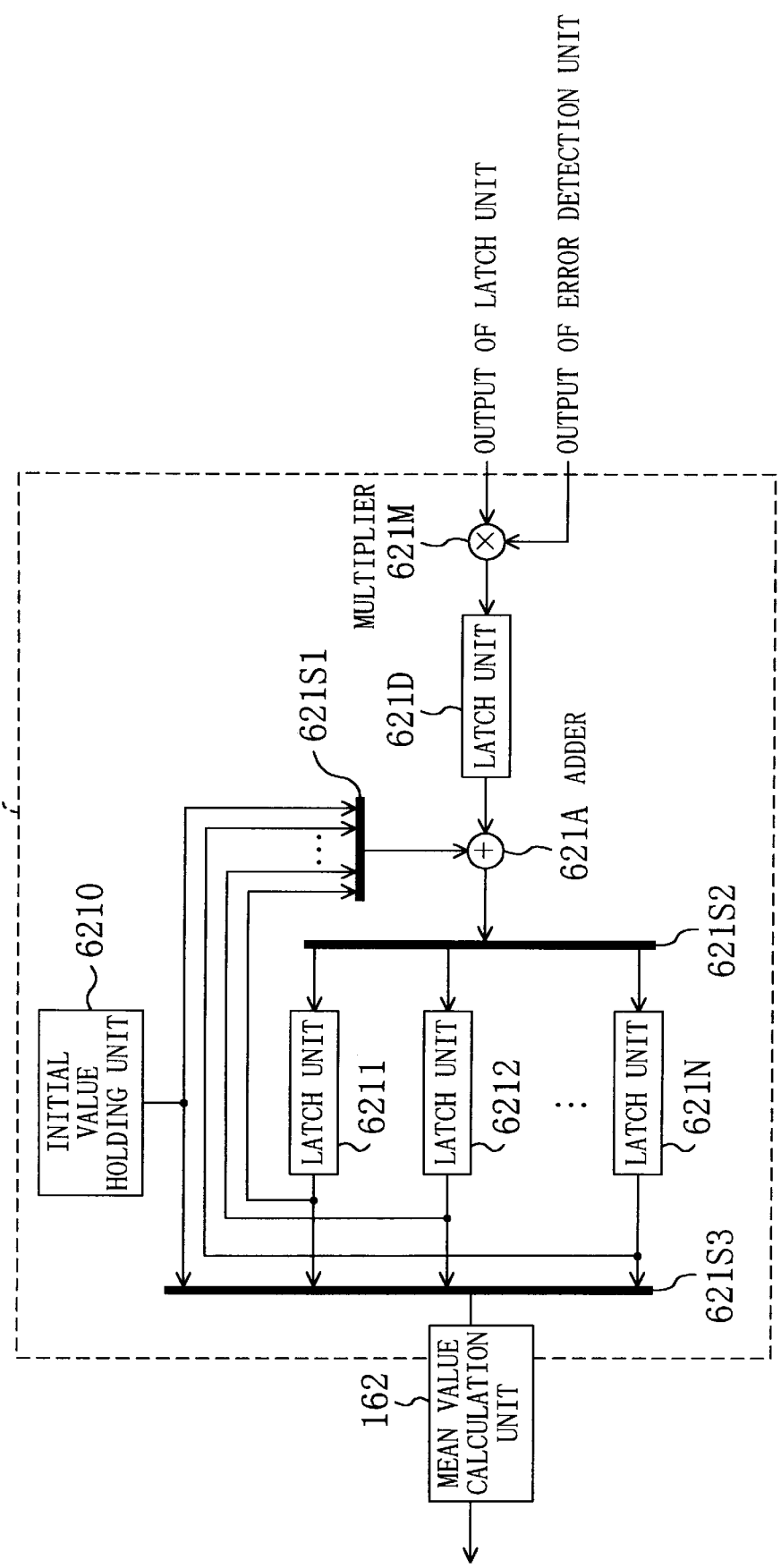
FIG. 21 shows the internal structure of the coefficient modification unit for a tap of the fifteenth embodiment of the present invention.

In the present embodiment, as shown in FIG. 21, a coefficient modification unit 612 for tap L (L=each value between 1 and N) included in a selection-type coefficient amendment unit has a mean value calculation unit 162 at the stage following the selector 621S3. This unit 162 takes an average of the outputs of the coefficient modification units 6211 to 621N for taps 1 to N every clock within a predetermined time period which comes immediately before the entering of the clock. The predetermined time period corresponds, for example, to a time period required for taking a round of the serial output of the weight coefficients of all the coefficient modification units 6211 to 621N for taps 1 to N. The mean weight coefficient outputted from the mean value calculation unit 162 is given to a corresponding multiplication unit.

Consequently, according to the present embodiment, in the same manner as the fourteenth embodiment, even if the output of the error detection unit 51 temporarily changes to a great extent due to noise or the like, it is possible to reduce the wrong update of the weight coefficient to be given to each multiplication unit.

EMBODIMENT 16

Figure 22:
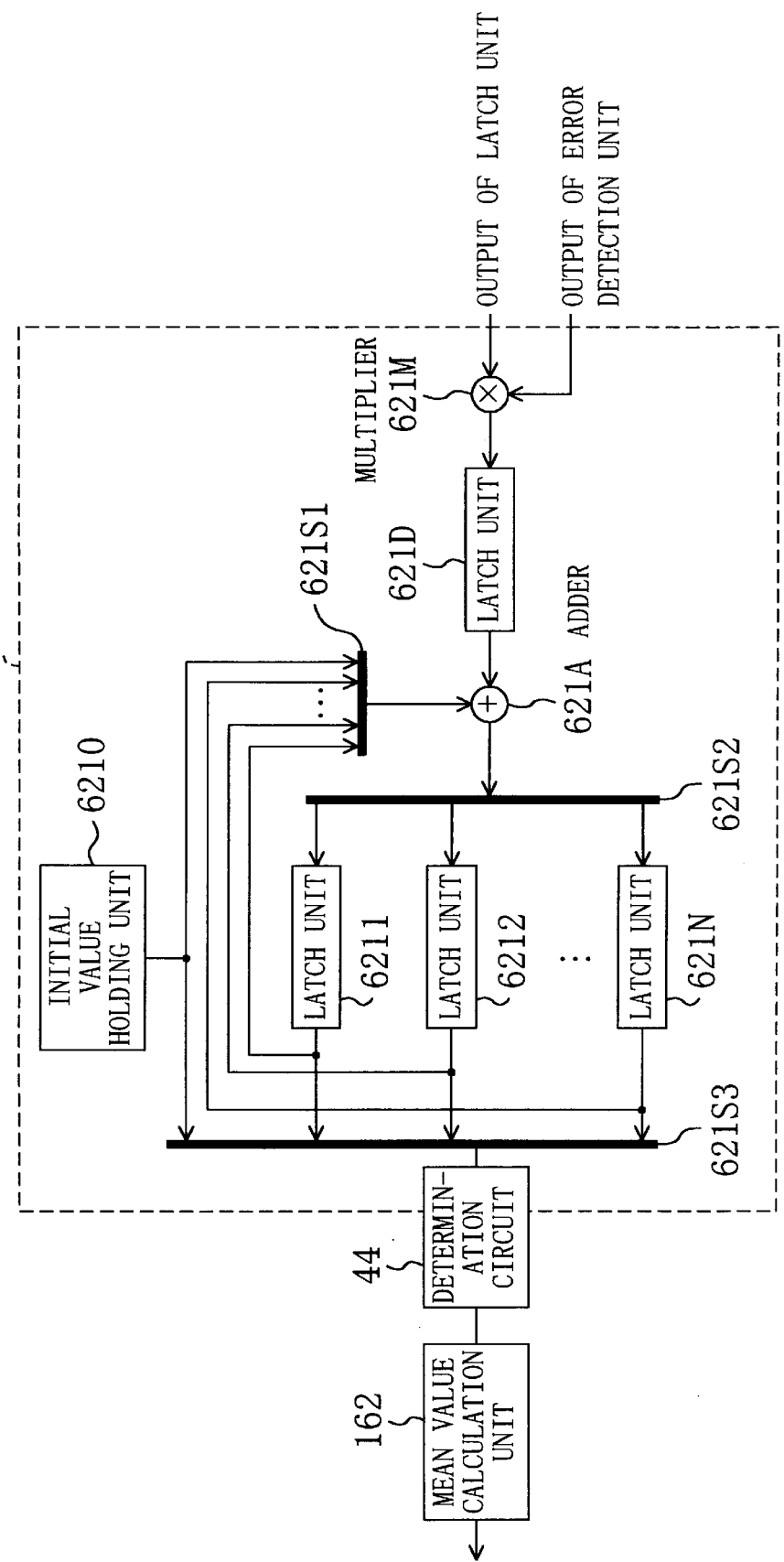
FIG. 22 shows the internal structure of the coefficient modification unit for a tap of the sixteenth embodiment of the present invention.

The present embodiment is an improvement of the fifteenth embodiment. In short, as shown in FIG. 22, a coefficient modification unit 613 for tap L includes a determination circuit 44 at the stage preceding a mean value calculation unit 162. The determination circuit 44 determines whether the value of the weight coefficient outputted from the selector 621S3 is between the upper limit value and the lower limit value. The upper and lower limit values are previously set in the determination circuit 44. When the value of the weight coefficient outputted from the selector 621S3 is between the upper limit value and the lower limit value, the weight coefficient is outputted to the mean value calculation unit 162 via the determination circuit 44. On the other hand, when it is above the upper limit value or below the lower limit value, the determination circuit 44 blocks the output to the mean value calculation unit 162.

When the value of the weight coefficient is above the upper limit value or below the lower limit value, the value of the weight coefficient is considered to have been wrongly updated due to noise or the like, and not regarded as an object for taking an average in the mean value calculation unit 162. As a result, according to the present embodiment, it is possible to further reduce the wrong update of a weight coefficient.

EMBODIMENT 17

Figure 23:
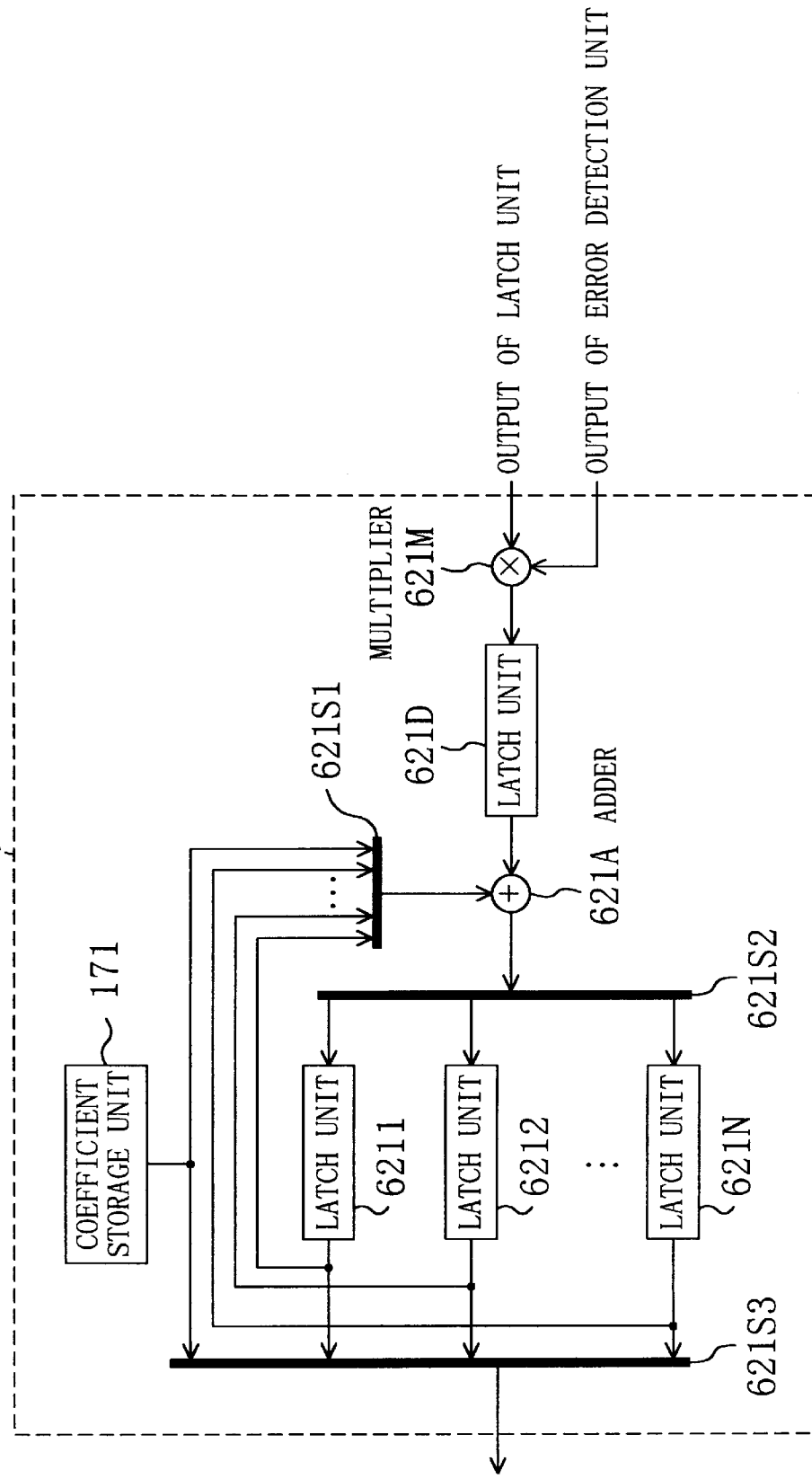
FIG. 23 shows the internal structure of the coefficient modification unit for a tap of the seventeenth embodiment of the present invention.

In the present embodiment, as shown in FIG. 23, a coefficient modification unit 614 for tap L includes a coefficient storage unit 171 in place of the initial value storage unit for storing an initial weight coefficient. The coefficient storage unit 171 sequentially stores updated weight coefficients which are outputted from the selector 621S3. The coefficient storage unit 171 is composed of storage elements such as flash memory which can hold the value of a weight coefficient even after the power is turned off.

Consequently, according to the present embodiment, when the power is turned on or when the operation of the adaptive auto equalizer is resumed, the value of the coefficient storage unit 171, that is, the final value of the weight coefficient in the previous adaptive control operation becomes the initial value of the weight coefficient to be given to the multiplication units of the transversal filter block 1. As a result, since the weight coefficient when the adaptive control is started or resumed becomes appropriate, the output of the transversal filter 1 can be converged upon the ideal output value at an early stage, which further improves the convergence.

EXAMPLE 18

Figure 24:
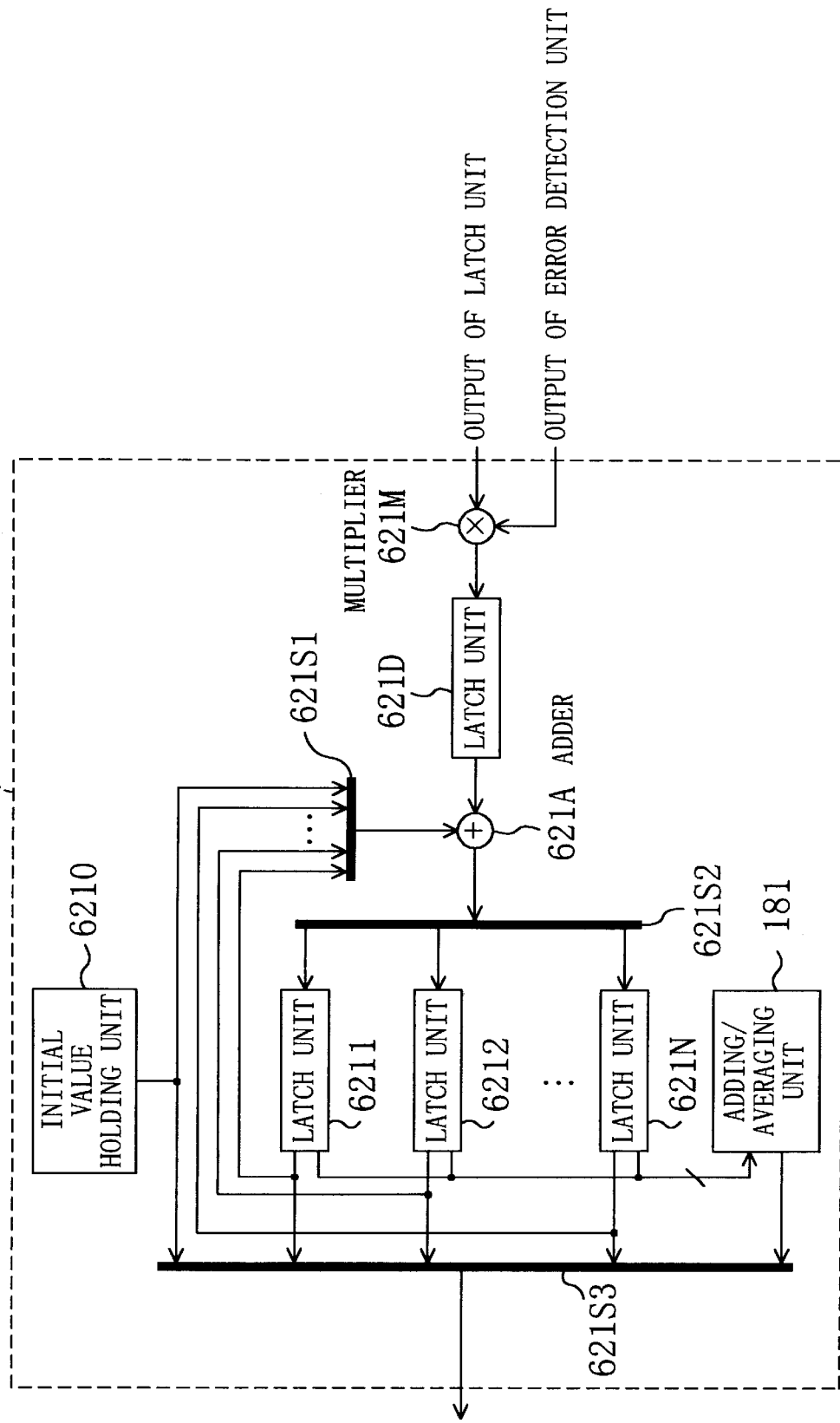
FIG. 24 shows the internal structure of the coefficient modification unit for a tap of the eighteenth embodiment of the present invention.
Figure 25:
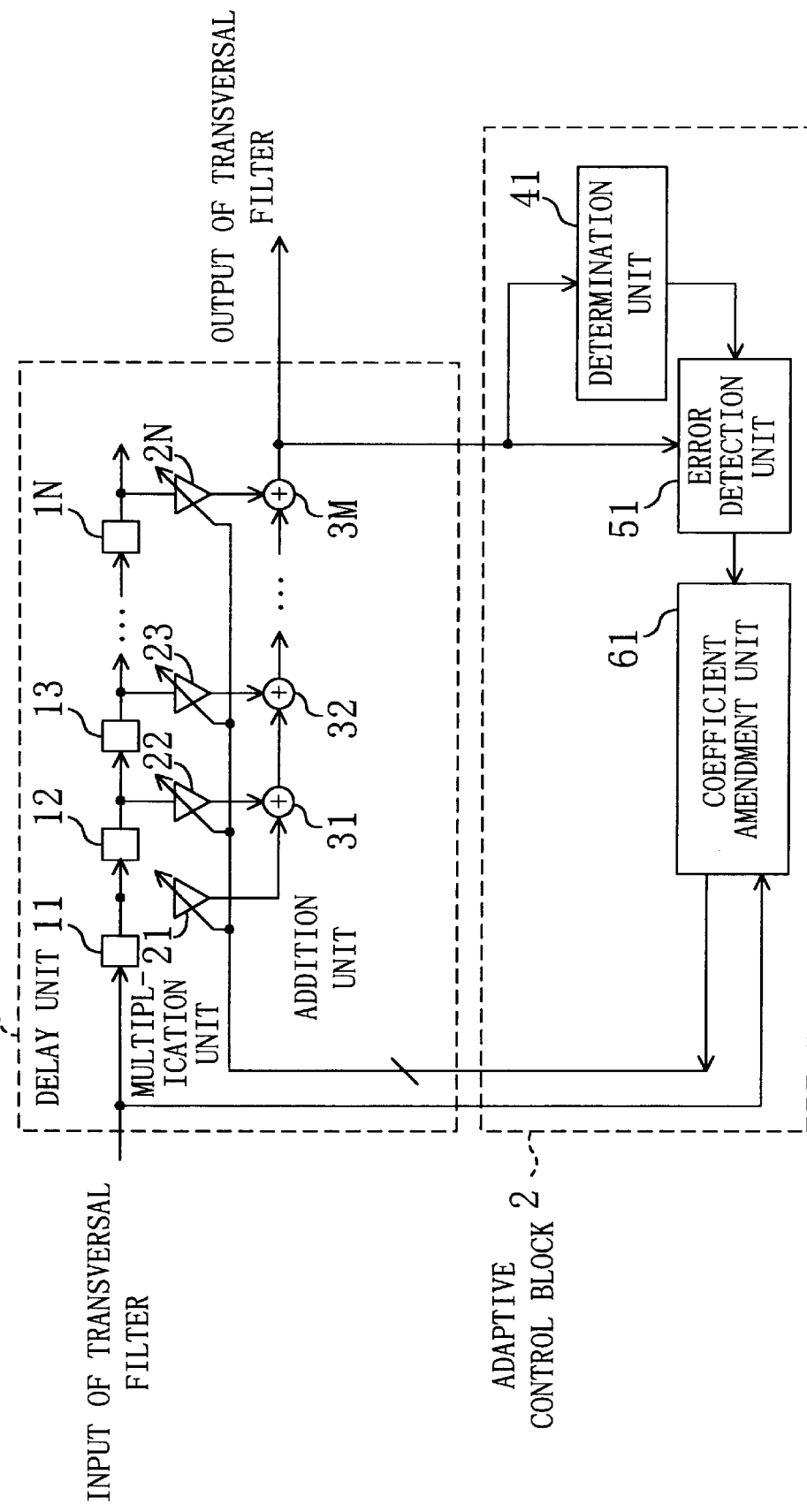
FIG. 25 shows the entire structure of a conventional adaptive auto equalizer.

In the present embodiment, as shown in FIG. 24, a coefficient modification unit 615 for tap L includes an adding/averaging unit 181. The adding/averaging unit 181 receives the outputs of the plurality of latch units (weight coefficient holding units) 6211, 6212 to 621N every clock, adds them together, calculates the mean weight coefficient, and outputs the calculated means weight coefficient to the selector 621S3.

While a recording medium such as a hard disk is either receiving or reproducing data and the adaptive auto equalizer is in operation, when the adaptive control block is exclusively turned off according to its purpose, that is, when the update of the weight coefficient is stopped and the transversal block 1 is exclusively operated by the weight coefficient with a fixed value given by the adaptive control block 2, if the updated final weight coefficient is wrongly updated due to noise or the like immediately before the adaptive control block is turned off, then the output of the transversal filter block 1 which uses the wrong weight coefficient is not converged upon the expected value. In the present embodiment, however, when the adaptive control block 2 is exclusively turned off, the mean weight coefficient calculated by the adding/averaging unit 181 is used as the weight coefficient to be given to the transversal block 1, so that the output of the transversal filter block 1 can be converged upon the expected value in a short time.

What is claimed is:

1. An adaptive auto equalizer comprising:
   a transversal filter for equalizing an input signal, said transversal filter including a plurality of delay units for delaying the input signal, a plurality of multiplication units for multiplying a weight coefficient with a delay signal of each of the plurality of delay units, and an addition unit for adding multiplication results of the plurality of multiplication units together;

a determination unit for receiving an output of the addition unit of said transversal filter and determining an expected value of the output;

an error detection unit for detecting an error between an output of said transversal filter and an output of said determination unit;

a selection-type coefficient amendment unit for entering the error outputted from said error detection unit and amending the weight coefficient to be given to each of the plurality of multiplication units, based on the error;

said selection-type coefficient amendment unit including coefficient modification units of a same number as the multiplication units, said coefficient modification units each calculating an amendment value of the weight coefficient and giving an amended weight coefficient to a corresponding one of the plurality of multiplication units;

each of said coefficient modification units including a plurality of weight coefficient holding units; and a plurality of amended weight coefficients are held in said plurality of weight coefficient holding units by repeatedly selecting one of said plurality of weight coefficient holding units every time the amendment value of the weight coefficient is calculated, so that the weight coefficients thus held are given to a corresponding one of the multiplication units one by one.

2. The adaptive auto equalizer of claim 1, wherein a number of said weight coefficient holding units provided in each of said coefficient modification units corresponds to a sum of each delay amount of said transversal filter, said determination unit, and said error detection unit.

3. The adaptive auto equalizer of claim 1 or 2, wherein the amended weight coefficient of each of said plurality of weight coefficient holding units is given to a corresponding one of the plurality of multiplication units in a time period corresponding to a sum of each delay amount of said transversal filter, said determination unit, and said error detection unit.

4. The adaptive auto equalizer of claim 1, wherein said selection-type coefficient amendment unit receives a control signal which designates a number of said weight coefficient holding units to be needed and amends the weight coefficient by using the number of said weight coefficient holding units to be needed which is designated by the control signal.

5. The adaptive auto equalizer of claim 1 further comprising:

a delay amount detection unit for entering the error outputted from said error detection unit and the input signal of said transversal filter, and detecting a delay time required before the amended weight coefficient is outputted, based on the error and the input signal; and said selection-type coefficient amendment unit calculating a number of said weight coefficient holding units to be needed, based on the delay time detected by said delay amount detection unit, and amending the weight coefficient by using the calculated number of said weight coefficient holding units to be needed.

6. The adaptive auto equalizer of claim 1 further comprising:

a switch which is put in an open position when a control signal is entered from outside so as to disconnect said error detection unit from said selection-type coefficient amendment unit.

7. The adaptive auto equalizer of claim 1 further comprising:

a determination circuit for entering the error outputted from said error detection unit and comparing the error with a setting level; and a switch which is put in an open position when said determination circuit determines that the error is equal to or higher than the setting level so as to disconnect said error detection unit from said selection-type coefficient amendment unit.

8. The adaptive auto equalizer of claim 1 further comprising:

a determination circuit for entering the output of said transversal filter and comparing an amplitude of the output with a setting level; and a switch which is put in an open position when said determination circuit determines that the amplitude of the output is equal to or higher than the setting level so as to disconnect said error detection unit from said selection-type coefficient amendment unit.

9. The adaptive auto equalizer of claim 1 further comprising:

a tap number control unit for entering the error outputted from said error detection unit and controlling a number of said coefficient modification units to be used, according to a size of the error.

10. The adaptive auto equalizer of claim 1 further comprising:

a modified tap number control unit for entering a control signal from outside and controlling a number of said coefficient modification units to be used, based on the control signal.

11. The adaptive auto equalizer of claim 1 further comprising:

a modified tap number/weight coefficient number control unit for entering a control signal from outside and controlling a number of said coefficient modification units to be used, and a number of said weight coefficient holding units to be used in said coefficient modification units to be used, based on the control signal.

12. The adaptive auto equalizer of claim 1 further comprising:

a counter which is disposed at a stage following said coefficient modification units and which restricts a number of the output of the plurality of amended weight coefficients from said coefficient modification units to the plurality of multiplication units to once in a predetermined number.

13. The adaptive auto equalizer of claim 12, wherein the predetermined number is set by a control signal entered from outside; and each of said coefficient modification units controls a number of said plurality of weight coefficient holding units to be used, based on the control signal.

14. The adaptive auto equalizer of claim 1 further comprising:

a signal-to-noise ratio measurement unit for entering the input signal of said transversal filter, measuring a signal-to-noise ratio of the input signal, and controlling a number of said coefficient modification units to be used, by the signal-to-noise ratio.

15. The adaptive auto equalizer of claim 1 further comprising:

a data identification unit for entering the input signal of said transversal filter, identifying a type of a recording medium which stores the input signal, based on the input signal, and controlling a number of said coefficient modification units to be used, by identification results.

16. The adaptive auto equalizer of claim 1 further comprising:

a mean value calculation unit for calculating a mean value of errors outputted from said error detection unit and controlling a number of said coefficient modification units to be used, according to the mean value of the errors.

17. The adaptive auto equalizer of claim 1 further comprising:

a mean value calculation unit for calculating a mean value of the weight coefficients outputted from said plurality of weight coefficient holding units and providing the mean value of the weight coefficients to a corresponding one of the multiplication units.

18. The adaptive auto equalizer of claim 1 further comprising:

a determination circuit for determining whether the weight coefficients outputted from said plurality of weight coefficient holding units are within a range of between a set upper limit value and a set lower limit value, and outputting the weight coefficients within the range to a following stage when the weight coefficients are within the range; and a mean value calculation unit for calculating a mean value of outputs of said determination circuit and controlling a number of said coefficient modification units to be used, by the mean value.

19. The adaptive auto equalizer of claim 1 further comprising:

a coefficient storage unit for storing a latest amended weight coefficient outputted from each of said coefficient modification units, the latest amended weight coefficient being used when a next operation is started.

20. The adaptive auto equalizer of claim 1 further comprising:

an adding/averaging unit for calculating a mean value of the weight coefficients held in said plurality of weight coefficient holding units; and when modification of the weight coefficients by said coefficient modification units is halted, the mean value of the weight coefficients calculated by said adding/averaging unit is outputted to a corresponding one of the plurality of multiplication units.

* * * * *